(12) United States Patent
Yan et al.

(10) Patent No.: US 12,167,625 B2
(45) Date of Patent: Dec. 10, 2024

(54) DISPLAY SCREEN AND ELECTRONIC DEVICE

(71) Applicant: Honor Device Co., Ltd., Shenzhen (CN)

(72) Inventors: Bin Yan, Shenzhen (CN); Xiaodong Zhou, Shenzhen (CN); Chuncheng Mao, Shenzhen (CN); Guangnan Xiao, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 442 days.

(21) Appl. No.: 17/617,429

(22) PCT Filed: Jun. 12, 2020

(86) PCT No.: PCT/CN2020/095786
§ 371 (c)(1),
(2) Date: Dec. 8, 2021

(87) PCT Pub. No.: WO2020/249075
PCT Pub. Date: Dec. 17, 2020

(65) Prior Publication Data
US 2022/0246884 A1 Aug. 4, 2022

(30) Foreign Application Priority Data

Jun. 14, 2019 (CN) .......................... 201910517884.0
Sep. 23, 2019 (CN) .......................... 201910900801.6

(51) Int. Cl.
*H10K 50/844* (2023.01)
*H10K 50/86* (2023.01)

(52) U.S. Cl.
CPC .......... *H10K 50/844* (2023.02); *H10K 50/86* (2023.02)

(58) Field of Classification Search
None
See application file for complete search history.

(56) References Cited

U.S. PATENT DOCUMENTS

| 9,236,419 B2 | 1/2016 | Kim |
| 10,030,845 B2 | 7/2018 | Oh et al. |
| 11,048,294 B2 | 6/2021 | Yin et al. |

(Continued)

FOREIGN PATENT DOCUMENTS

| CN | 104009186 A | 8/2014 |
| CN | 104266116 A | 1/2015 |

(Continued)

*Primary Examiner* — Michelle Mandala
*Assistant Examiner* — Jordan M Klein
(74) *Attorney, Agent, or Firm* — Leydig, Voit & Mayer, Ltd.

(57) ABSTRACT

A display screen and an electronic device are provided. The display screen comprises a substrate, an encapsulation layer, and a display layer located between the substrate and the encapsulation layer. The display layer has at least one first through hole that penetrates to both side surfaces of the display layer. A first transparent filler is arranged within the at least one first through hole. In the display screen, arrangement of the transparent filler within the first through hole effectively reduces deformation of the substrate and the encapsulation layer, thereby preventing undesirable phenomena such as rainbow patterns.

20 Claims, 15 Drawing Sheets

(56) References Cited

U.S. PATENT DOCUMENTS

| | | |
|---|---|---|
| 11,269,210 B2 | 3/2022 | Liu |
| 2016/0103366 A1 | 4/2016 | Chen et al. |
| 2017/0308244 A1 | 10/2017 | Su et al. |
| 2019/0051711 A1 | 2/2019 | Lee et al. |
| 2019/0079622 A1 | 3/2019 | Choi et al. |
| 2019/0123115 A1 | 4/2019 | Sun et al. |
| 2019/0157586 A1 | 5/2019 | Liu et al. |
| 2019/0220649 A1* | 7/2019 | Zhu .................. H10K 59/65 |
| 2019/0393444 A1* | 12/2019 | Nam .................. G06F 1/1643 |
| 2020/0083475 A1* | 3/2020 | Kang .................. H10K 59/124 |
| 2020/0185643 A1* | 6/2020 | Moon .................. G02F 1/133528 |
| 2020/0287161 A1* | 9/2020 | Kim .................. H10K 50/868 |
| 2020/0328375 A1* | 10/2020 | Won .................. H10K 71/00 |
| 2021/0365656 A1 | 11/2021 | Xu et al. |
| 2022/0013600 A1 | 1/2022 | Zhang et al. |
| 2022/0208897 A1* | 6/2022 | Yue .................. H04N 23/55 |
| 2022/0246884 A1 | 8/2022 | Yan et al. |

FOREIGN PATENT DOCUMENTS

| | | | |
|---|---|---|---|
| CN | 105572965 A | | 5/2016 |
| CN | 206363714 U | | 7/2017 |
| CN | 107305454 A | | 10/2017 |
| CN | 107748874 A | | 3/2018 |
| CN | 107946341 A | | 4/2018 |
| CN | 108804991 A | | 11/2018 |
| CN | 108885376 A | | 11/2018 |
| CN | 108969621 A | | 12/2018 |
| CN | 108983468 A | | 12/2018 |
| CN | 109001933 A | | 12/2018 |
| CN | 109068044 A | | 12/2018 |
| CN | 109100891 A | | 12/2018 |
| CN | 109120753 A | | 1/2019 |
| CN | 109148724 A | | 1/2019 |
| CN | 109164648 A | | 1/2019 |
| CN | 109509708 A | | 3/2019 |
| CN | 109541849 A | | 3/2019 |
| CN | 208609032 U | | 3/2019 |
| CN | 109637373 A | | 4/2019 |
| CN | 109752873 A | | 5/2019 |
| CN | 109753181 A | | 5/2019 |
| CN | 109756478 A | | 5/2019 |
| CN | 109767699 A | | 5/2019 |
| CN | 208819534 U | | 5/2019 |
| CN | 208862900 U | | 5/2019 |
| CN | 109870840 A | | 6/2019 |
| CN | 110853507 A | | 2/2020 |
| JP | 2014103458 A | | 6/2014 |
| KR | 1020180047507 A | | 5/2018 |
| KR | 1020190030298 A | | 3/2019 |
| WO | 2019006740 A1 | | 1/2019 |

\* cited by examiner

DISPLAY SCREEN AND ELECTRONIC DEVICE

CROSS-REFERENCE TO RELATED APPLICATIONS

This application is a National Stage of International Application No. PCT/CN2020/095786, filed on Jun. 12, 2020, which claims priority to Chinese Patent Application No. 201910517884.0, filed on Jun. 14, 2019, and Chinese Patent Application No. 201910900801.6, filed on Sep. 23, 2019. The disclosures of each of the aforementioned applications are hereby incorporated by reference in their entireties.

TECHNICAL FIELD

This application relates to the field of display technologies, and in particular, to a display screen and an electronic device.

BACKGROUND

Under the current development trend of electronic devices, a higher screen-to-body ratio has gradually become the main pursuit of consumers and manufacturers. A mobile phone is used as an example. In addition to a screen, the front of the mobile phone usually needs to be equipped with devices such as a camera. To reduce space occupied by the devices such as a camera on the front of the mobile phone, so as to achieve a higher screen-to-body ratio, some manufacturers arrange the camera inside the mobile phone, and perform puncturing on the screen so that the camera can capture images of the outside world through the through hole on the screen.

During puncturing on the screen, some manufacturers remove opaque components (such as a light-emitting layer and a supporting material) between the substrate and the encapsulation layer, so as to form a through hole structure with good light permeability. However, this results in formation of a gap between the substrate and the encapsulation layer. When the substrate has specific rigidity (for example, the substrate is made of silicon oxide, silicon oxynitride, or the like), under the action of an internal and external pressure difference, the substrate and the encapsulation layer are prone to deformation, thereby affecting normal operation of the camera.

SUMMARY

This application provides a display screen and an electronic device that can effectively avoid affecting normal operation of optical components as a result of puncturing on the display screen.

According to an aspect, an embodiment of this application provides a display screen, including a transparent substrate, an encapsulation film layer, and a display layer located between the transparent substrate and the encapsulation film layer, where the display layer has at least one first through hole that penetrates to both side surfaces of the display layer, and a first transparent filler is arranged within the at least one first through hole.

Specifically, the first transparent filler may be a gaseous substance or a solid substance.

For example, when the first transparent filler is a gaseous substance, air pressure in the first through hole can be effectively controlled by adjusting an amount of gas in the first through hole, so as to ensure that a pressure difference between the inside and the outside of the first through hole is small. This effectively prevents the transparent substrate and the encapsulation film layer from being bent and deformed, so as to effectively prevent adverse impact of the deformation of the transparent substrate and the encapsulation film layer on an optical component. When the first transparent filler is a solid substance, a volume of gas or vacuum within the first through hole can be reduced by occupying the space within the first through hole, so as to reduce the maximum pressure difference between the inside and the outside of the first through hole, thereby effectively preventing the transparent substrate and the encapsulation film layer from being bent and deformed. The solid first transparent filler can further form a support and connection between the transparent substrate and the encapsulation film layer, preventing the transparent substrate and the encapsulation film layer from being bent and deformed, thereby effectively preventing adverse impact of the deformation of the transparent substrate and the encapsulation film layer on an optical component. In actual application, the first transparent filler may fill up the first through hole, or may be arranged in a partial area of the first through hole.

During specific implementation, the first transparent filler may be a material that has a refractive index close to that of the transparent substrate or the encapsulation film layer, so as to prevent the transparent substrate and the encapsulation film layer from being deformed, and further reduce reflected light at an interface between the first transparent filler and the transparent substrate, and reflected light at an interface between the first transparent filler and the encapsulation film layer, thereby improving working performance of an optical component such as a camera.

To reduce the reflected light at the interface between the first transparent filler and the transparent substrate, in some specific embodiments, a first antireflective film layer may be arranged at a position of the transparent substrate corresponding to the first through hole; or a second antireflective film layer may be arranged at a position of the encapsulation film layer corresponding to the first through hole, so as to reduce intensity of the reflected light.

In addition, in some specific embodiments, the first transparent filler may not be arranged in the first through hole, and adverse impact of display screen puncturing on an optical component is mitigated only by reducing the intensity of the reflected light. Specifically, when the first transparent filler is not filled in the first through hole, a first antireflective film layer may be arranged at a position of the transparent substrate corresponding to the first through hole, so as to reduce the intensity of the reflected light of the transparent substrate; correspondingly, a second antireflective film layer may be arranged at a position of the encapsulation film layer corresponding to the first through hole, so as to reduce the intensity of the reflected light of the encapsulation film layer.

In addition, to prevent the transparent substrate and the encapsulation film layer from affecting the normal operation of optical components such as the camera, in some specific embodiments, the distance between the transparent substrate and the encapsulation film layer may be increased.

For example, at the first through hole, the distance between the transparent substrate and the encapsulation film layer may be kept above 10 µm to effectively avoid affecting the normal operation of optical components such as the camera.

During specific implementation, a first recess may be arranged on a side surface of the transparent substrate directly facing the first through hole, so as to increase the distance between the transparent substrate and the encapsulation film layer. Specifically, the first recess may be a blind hole, and a diameter of the blind hole and a diameter of the first through hole may be the same or substantially the same.

During specific production, the first recess may be formed by processes such as etching and grinding. For example, when the transparent substrate is made of silicon oxide, hydrofluoric acid or the like can be used to process the transparent substrate to form the first recess. When the transparent substrate is made of polyimide, a process such as grinding can be used to process the transparent substrate to form the first recess.

In some other specific embodiments, a second recess similar to the first recess may alternatively be arranged in the encapsulation film layer.

Specifically, a second recess may be arranged on a side surface of the encapsulation film layer directly facing the first through hole, so as to increase the distance between the transparent substrate and the encapsulation film layer. Specifically, the second recess may be a blind hole, and a diameter of the blind hole and a diameter of the first through hole may be the same or substantially the same.

During specific production, the second recess may be formed by processes such as etching and grinding. For example, when the encapsulation film layer is made of silicon oxide, hydrofluoric acid or the like can be used to process the encapsulation film layer to form the second recess. When the encapsulation film layer is made of polyimide, a process such as grinding can be used to process the encapsulation film layer to form the second recess.

To increase the distance between the transparent substrate and the encapsulation film layer at the first through hole, a distance between the entire transparent substrate and the entire encapsulation film layer may alternatively be increased.

During specific implementation, a thickness of the display layer may be appropriately increased, or a thickened film layer may be arranged between the display layer and the encapsulation film layer.

During specific implementation, the thickened film layer can be made of a material with good light permeability, or can be made of a material with good light-shielding properties.

Specifically, when the thickened film layer is made of a material with good light permeability (such as silicon oxide, polyimide, and the like), the thickened film layer does not affect a display effect of the light-emitting layer (that is, does not shield the light-emitting layer), and does not shield the first through hole, either. Therefore, the through hole structure may not be arranged in the area corresponding to the first through hole.

When the thickened film layer is made of a material with good light-shielding properties, in order not to affect the display effect of the display layer, the thickened film layer may include a plurality of blocks arranged at intervals, or the thickened film layer may be patterned to reduce the shielding of the display layer as far as possible, and at the same time, increase the distance between the transparent substrate and the encapsulation film layer. In addition, to prevent the thickened film layer from shielding the first through hole, in some specific embodiments, a second through hole may be arranged in an area corresponding to the first through hole. During specific implementation, projection of the second through hole on the display layer should completely cover the first through hole, that is, when the first through hole is coaxial with the second through hole, an aperture of the second through hole is not smaller than an aperture of the first through hole. When the first through hole is not coaxial with the second through hole, the aperture of the second through hole should be larger than the aperture of the first through hole, so as to prevent the thickened film layer from shielding the first through hole.

In some specific embodiments, the display screen may further include a polarizer, and the polarizer may be located on the side surface of the encapsulation film layer away from the display layer; in order not to affect the working performance of optical components such as the camera, the polarizer is provided with a third through hole directly facing the first through hole, and projection of the third through hole on the display layer completely covers the first through hole.

Specifically, when the first through hole and the third through hole are arranged coaxially, an aperture of the third through hole should not be smaller than the aperture of the first through hole, so as to prevent the polarizer from shielding the first through hole; when the first through hole is not coaxial with the third through hole, the aperture of the third through hole should be larger than the aperture of the first through hole, so as to prevent the polarizer from shielding the first through hole.

In actual application, optical components such as the camera mounted below the display screen have an image capture angle similar to a cone; therefore, a diameter of the third through hole may be slightly larger than the diameter of the first through hole. During specific implementation, the opening diameter of the first through hole may be minimized, so as to maximize the supporting effect of the display layer between the transparent substrate and the encapsulation film layer, and prevent the transparent substrate and the encapsulation film layer from being deformed. However, because a cathode layer or a wire (such as a driver circuit) in the display layer is usually made of a metal material, the cathode layer or the wire has a high light-reflecting characteristic. As a result, when watching the screen, a user sees a circle of bright lines formed by the reflection of the cathode layer. In some specific embodiments, the area of the thickened film layer close to the first through hole may be made of opaque material, so as to shield the exposed cathode layer.

In some other specific embodiments, an additional light-shielding layer may alternatively be arranged to shield the exposed cathode layer.

Specifically, the display screen may further include a light-shielding layer, and the light-shielding layer may be arranged between the display layer and the encapsulation film layer, and cover the projection area of the third through hole on the display layer. Because the aperture of the third through hole is larger than the aperture of the first through hole, the projection of the third through hole on the display layer is a circular ring area; during specific implementation, the light-shielding layer may be a circular ring structure to well shield the exposed cathode layer. In other embodiments, the light-shielding layer may alternatively be arranged on the side surface of the encapsulation film layer away from the display layer, or the light-shielding layer may be arranged on both sides of the encapsulation film layer.

During specific implementation, the light-shielding layer may be made of ink, vinyl, or another material with good light-shielding properties.

In addition, in some specific embodiments, to make the display screen have good structural strength and prevent the display screen from being damaged when subjected to external force, the display screen may further include a transparent cover plate. Specifically, the transparent cover plate may be attached to the side surface of the polarizer away from the encapsulation film layer through materials such as optically clear adhesive (OCA).

Because the polarizer is provided with a third through hole, to prevent deformation of the encapsulation film layer, in some specific embodiments, a second transparent filler similar to the first transparent filler may further be arranged in the third through hole to effectively prevent phenomena such as rainbow patterns.

According to another aspect, an embodiment of this application further provides an electronic device, including an optical component and the display screen according to any one of the foregoing embodiments; the optical component is arranged directly facing the first through hole.

In some specific embodiments, the optical component may include a camera, a light sensor, a distance sensor, and the like. To increase a screen-to-body ratio of the screen, the optical component may be arranged below the display screen. In addition, the display screen may be provided with a plurality of light-transmitting hole structures that separately correspond to the optical component, so that external light can enter the light sensor and the distance sensor through the light-transmitting hole in the display screen.

DESCRIPTION OF EMBODIMENTS

To make the objectives, technical solutions, and advantages of this application clearer, the following further describes this application in detail with reference to the accompanying drawings.

There are many types of display screens. For example, in electronic devices (such as mobile phones, tablet computers, monitors, and TVs), at present, commonly used display screens mainly include two categories: LCD (Liquid Crystal Display) display screens and OLED (Organic Light-Emitting Diode) display screens.

Figure 1:
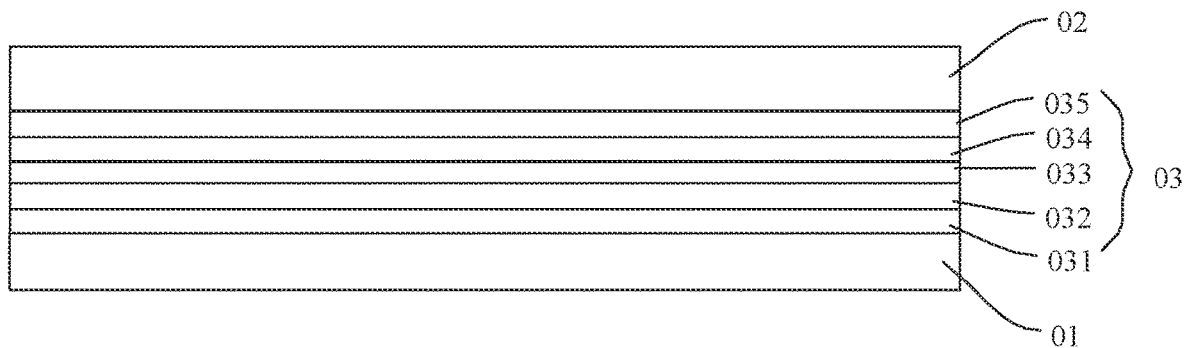
FIG. 1 is a schematic structural diagram of a display screen according to an embodiment of this application.

As shown in FIG. 1, an OLED display screen mainly includes a substrate 01, an encapsulation layer 02, and a light-emitting layer 03 arranged between the substrate 01 and the encapsulation layer 02. The light-emitting layer 03 may include an anode layer 031, a hole transport layer 032, an organic light-emitting layer 033, an electron transport layer 034, a cathode layer 035, and the like that are sequentially stacked from the substrate 01 to the encapsulation layer 02. When the anode layer 031 and the cathode layer 035 are energized, electrons and holes migrate from the electron transport layer 034 and the hole transport layer 032 to the organic light-emitting layer 033, and meet in the organic light-emitting layer 033 to form excitons and excite light-emitting molecules to produce visible light to achieve the purpose of display. Based on different bendable characteristics of the substrate 01, the OLED display screen is divided into two categories: a flexible OLED display screen and a rigid OLED display screen. Specifically, the flexible OLED display screen may use materials such as polyimide as the substrate 01, so that the flexible OLED display screen has good bendability; the rigid OLED display screen may use materials such as silicon oxide as the substrate 01, so that the rigid OLED display screen has good rigidity.

Figure 2:
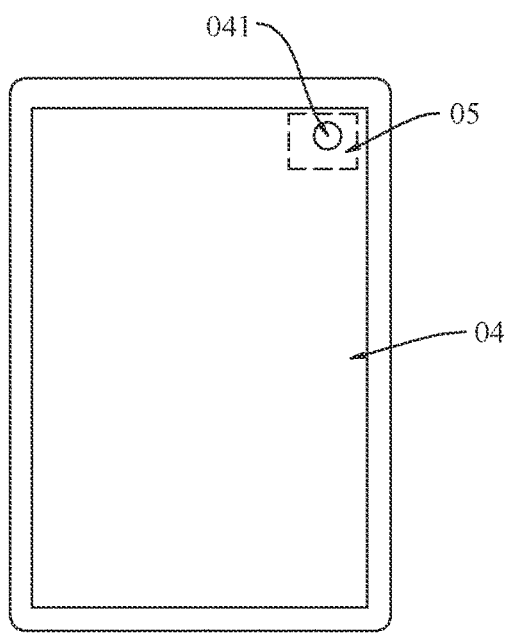
FIG. 2 is a schematic structural diagram of a mobile phone according to an embodiment of this application.

As shown in FIG. 2, a mobile phone is used as an example. In actual application, the front of the mobile phone needs to be provided with a display screen 04, and further needs to be provided with optical components such as a camera 05 (which may alternatively be a light sensor or a distance sensor). To achieve a higher screen-to-body ratio, the display screen 04 may be provided with a light-transmitting hole 041, and the optical components such as the camera 05 may be placed on a lower side of the display screen 04, so that external light can enter the optical components such as the camera 05 through the light-transmitting hole 041. In actual application, the light-transmitting hole 041 may be formed in a plurality of manners. For example, when the display screen 04 is made, a light-shielding part (such as a display layer 03) may not be prepared in the area in which the light-transmitting hole 041 is to be formed. Alternatively, a light-shielding part (such as a display layer 03) may be subsequently removed by using processes such as etching, so as to form the light-transmitting hole 041.

Figure 3:
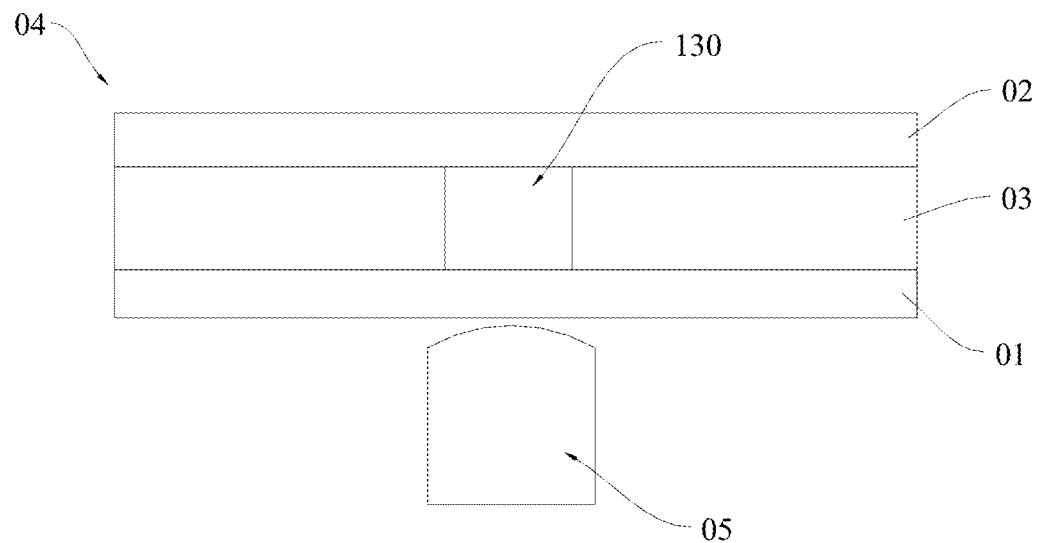
FIG. 3 is a schematic structural diagram of a combination of a display screen and a camera according to an embodiment of this application.
Figure 4:
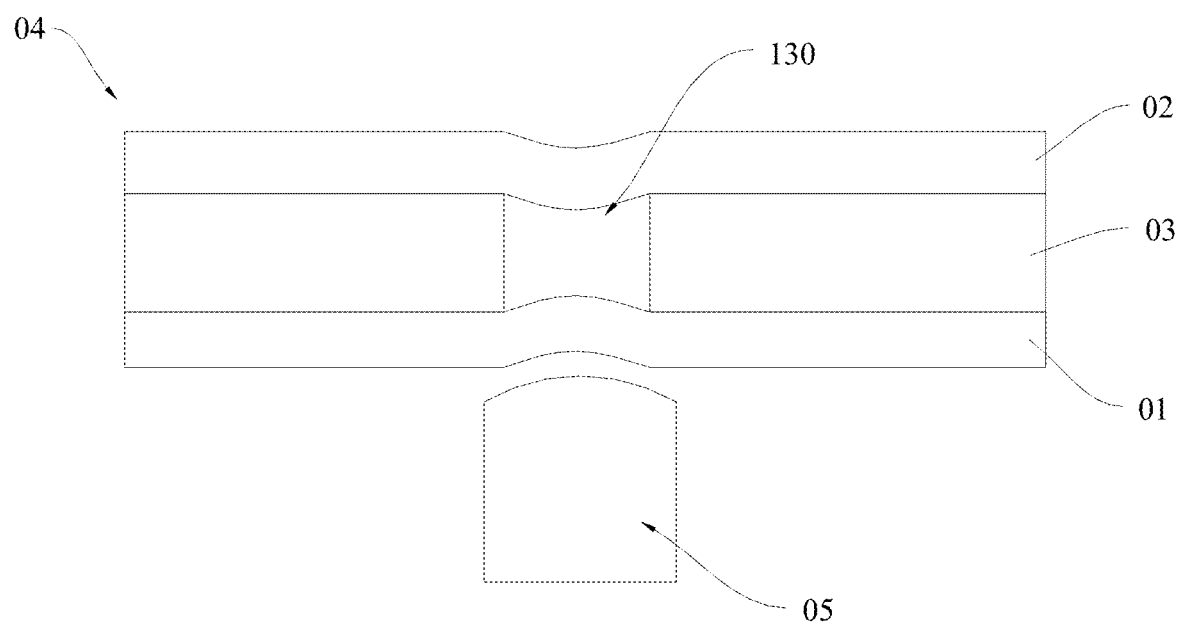
FIG. 4 is a schematic structural diagram of another combination of a display screen and a camera according to an embodiment of this application.

Referring to FIG. 3, in each composition structure of the display screen 04, because the display layer 03 has poor light permeability, to form a light-transmitting hole 041 on the display screen 04, the display layer 03 may be provided with a first through hole 130. However, in actual application, after the display layer 03 is punctured, the support between the encapsulation layer 02 and the substrate 01 at the first through hole 130 is lost. As shown in FIG. 4, for example, the display screen 04 is a rigid OLED display screen. When there is a pressure difference between the first through hole 130 and the outside, the encapsulation layer 02 and the substrate 01 are deformed, causing adverse impact on the optical components such as the camera 05. Specifically, after the external light enters the encapsulation layer 02, a part of the light directly enters the optical components such as the camera 05 underneath through the substrate 01; the other part of the light is reflected twice or more times between the encapsulation layer 02 and the substrate 01, and then enters the optical components such as the camera 05 underneath through the substrate 01. Because the encapsulation layer 02 and the substrate 01 are deformed at the first through hole 130, the distance between the encapsulation layer 02 and the substrate 01 is uneven. Consequently, the light directly entering the camera and the light entering the camera after a plurality of reflections interfere with each other, thereby affecting normal operation of the optical components such as the camera 05. For example, when the optical component is the camera 05, undesirable phenomena such as rainbow patterns appear. For this reason, the embodiments of this application provide a display screen that can effectively avoid the foregoing undesirable phenomena.

Terms used in the following embodiments are merely intended for the purpose of describing specific embodiments, but not intended to limit this application. The terms "one", "a" and "this" of singular forms used in this specification and the appended claims of this application are also intended to include, for example, the form of "one or more", unless otherwise specified in the context clearly. It should be further understood that in the following embodiments of this application, "at least one" and "one or more" mean one, two, or more than two. The term "and/or" is used to describe an association relationship between associated objects, and indicates that three relationships may exist. For example, A and/or B may represent the following three cases: Only A exists, both A and B exist, and only B exists. A and B may be singular or plural. The character "/" generally indicates an "or" relationship between associated objects.

Referring to "one embodiment" or "some embodiments" or the like described in this specification means that one or more embodiments of this application include a specific feature, structure, or characteristic described with reference to the embodiment. Therefore, the statements "in one embodiment", "in some embodiments", "in some other embodiments", and the like appearing at different locations in this specification do not mean that these embodiments are all necessarily referred to, but mean "one or more but not all embodiments", unless otherwise specifically emphasized in other ways. The terms "include", "comprise", "have", and their variants all mean "including but not limited to", unless otherwise specifically emphasized in other ways.

Figure 5:
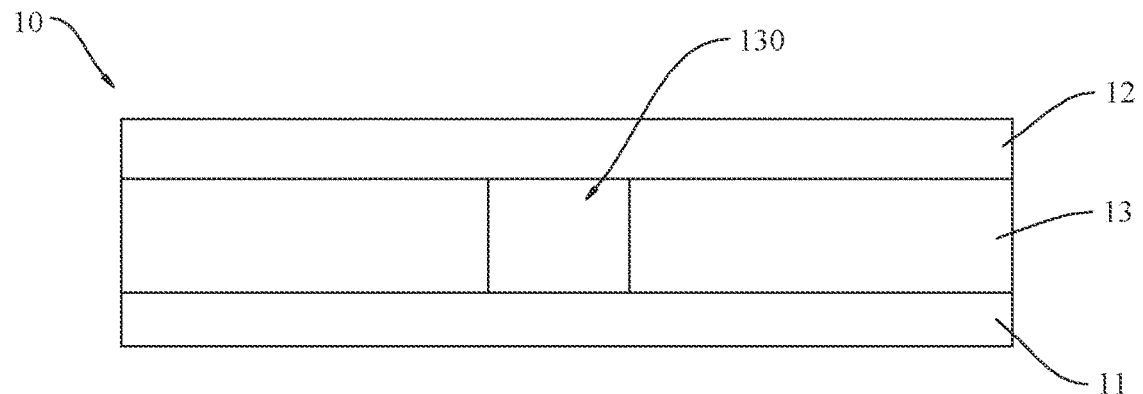
FIG. 5 is a schematic structural diagram of a display screen according to an embodiment of this application.
Figure 6:
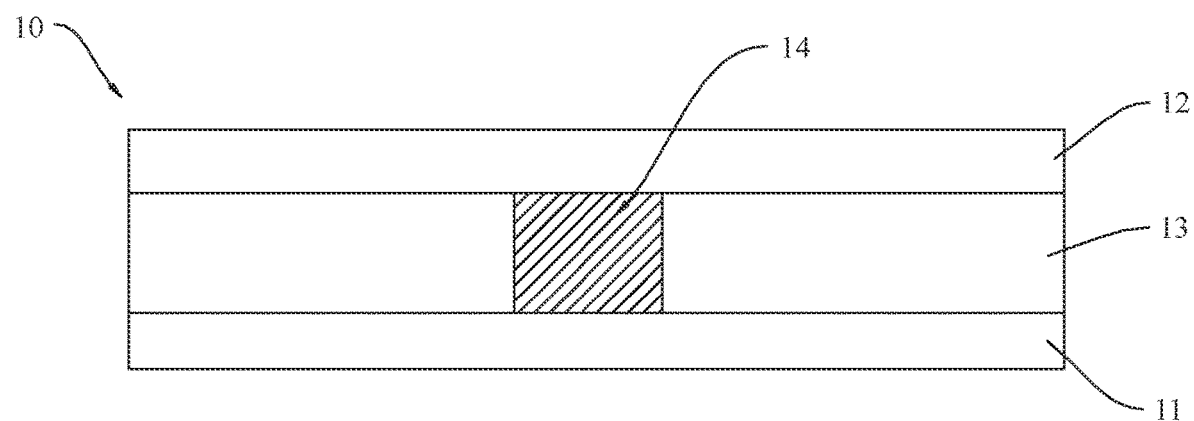
FIG. 6 is a schematic structural diagram of another display screen according to an embodiment of this application.

As shown in FIG. 5, in an embodiment provided in this application, the display screen 10 includes a transparent substrate 11, an encapsulation film layer 12, and a display layer 13 located between the transparent substrate 11 and the encapsulation film layer 12. The display layer 13 has at least one first through hole 130 (only one is shown in the figure) that penetrates to both side surfaces of the display layer 13. As shown in FIG. 6, the at least one first through hole 130 is provided with a first transparent filler 14 for supporting the transparent substrate 11 and the encapsulation film layer 12.

Specifically, the first transparent filler 14 may be a gaseous substance or a solid substance. For example, when the first transparent filler 14 is a gaseous substance, which may be an inert gas such as nitrogen, ammonia, or fluorine, in actual application, air pressure in the first through hole 130 can be effectively controlled by adjusting an amount of gas in the first through hole 130, so as to ensure that a pressure difference between the inside and the outside of the first through hole 130 is small. This effectively prevents the transparent substrate 11 and the encapsulation film layer 12 from being bent and deformed, so as to effectively prevent adverse impact of the deformation of the transparent substrate 11 and the encapsulation film layer 12 on an optical component. When the first transparent filler 14 is a solid substance, it may be materials such as indium tin oxide (ITO), optically clear adhesive (OCA), or the like, so as to form a support and connection between the transparent substrate 11 and the encapsulation film layer 12, preventing the transparent substrate 11 and the encapsulation film layer 12 from being bent and deformed, thereby effectively preventing adverse impact of the deformation of the transparent substrate 11 and the encapsulation film layer 12 on an optical component. In actual application, the first transparent filler 14 may fill up the first through hole 130, or may be arranged in a partial area of the first through hole 130.

During specific implementation, the transparent substrate 11 can be made of a material such as silicon oxide or silicon oxynitride, so that the display screen 04 has specific rigidity, the encapsulation film layer 12 can be made of an inorganic material such as silicon oxide, silicon oxynitride, or polyamide, or be made of an organic material such as polyimide. The first transparent filler 14 may be a material that has a refractive index close to that of the transparent substrate 11 or the encapsulation film layer 12, so as to prevent the transparent substrate 11 and the encapsulation film layer 12 from being deformed, and further reduce reflected light at an interface between the first transparent filler 14 and the transparent substrate 11, and reflected light at an interface between the first transparent filler 14 and the encapsulation film layer 12, thereby improving working performance of an optical component such as a camera. Specifically, to improve the working performance of an optical component such as a camera, intensity of light reflected by the encapsulation film layer 12 and the transparent substrate 11 may alternatively be reduced.

For example, to reduce the reflected light at the interface between the first transparent filler 14 and the transparent substrate 11, in some specific embodiments, a first antireflective film layer 111 may be arranged at a position of the transparent substrate 11 corresponding to the first through hole 130. In addition, when the first transparent filler 14 is not arranged in the first through hole 130, the first antireflective film layer 111 may be arranged at the position of the transparent substrate 11 corresponding to the first through hole 130, so as to reduce the reflected light at the interface between (vacuum inside) the first through hole 130 and the transparent substrate 11.

Figure 7:
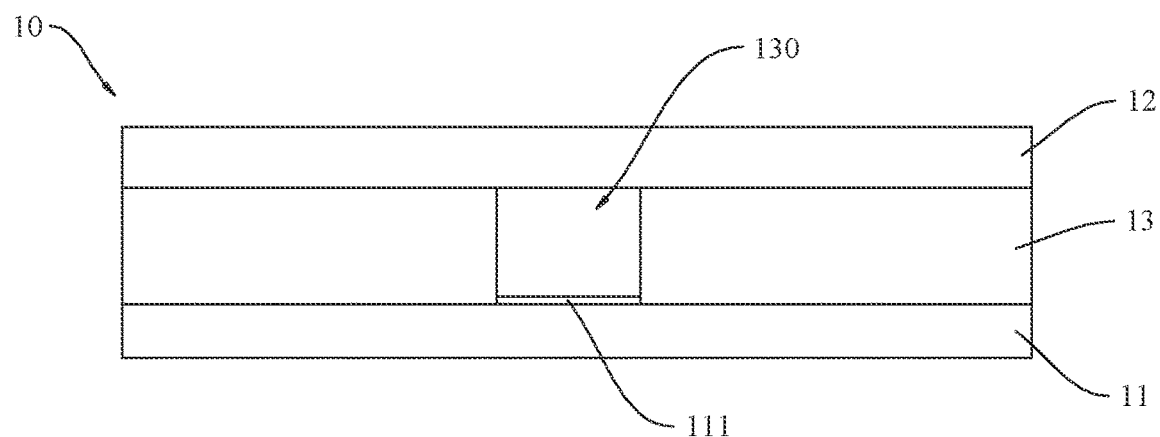
FIG. 7 is a schematic structural diagram of still another display screen according to an embodiment of this application.
Figure 8:
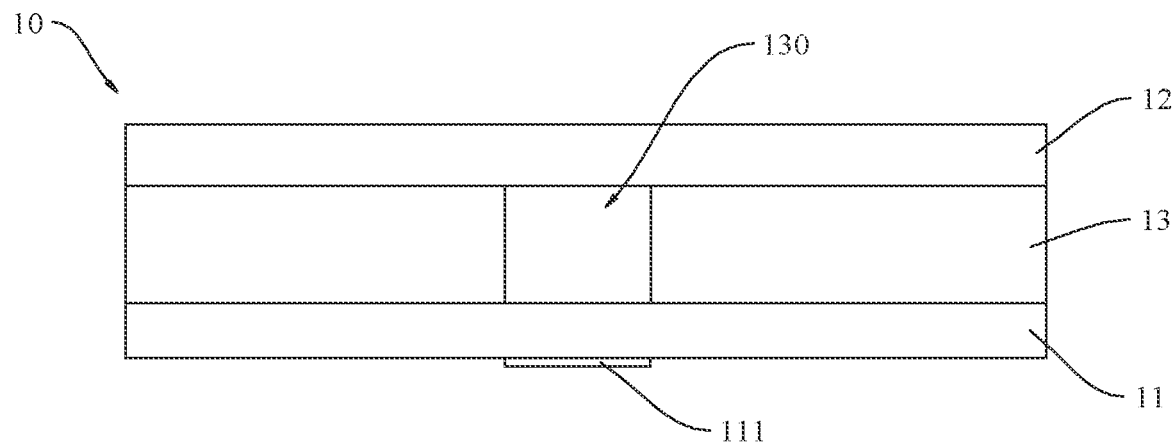
FIG. 8 is a schematic structural diagram of still another display screen according to an embodiment of this application.
Figure 9:
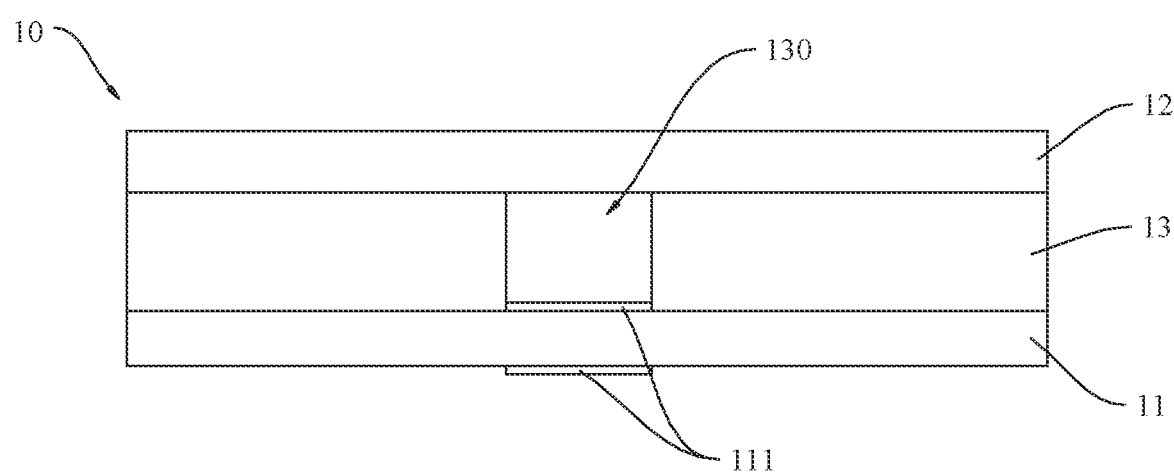
FIG. 9 is a schematic structural diagram of another display screen according to an embodiment of this application.

During specific implementation, as shown in FIG. 7, the first antireflective film layer 111 may be arranged on a side surface of the transparent substrate 11 close to the first through hole 130, so as to reduce the reflected light on the upper surface of the transparent substrate 11. As shown in FIG. 8, the first antireflective film layer 111 may alternatively be arranged on a side surface of the transparent substrate 11 away from the first through hole 130, so as to reduce the reflected light on the lower surface of the transparent substrate 11. In some specific embodiments, as shown in FIG. 9, the first antireflective film layer 111 may alternatively be arranged on both sides of the transparent substrate 11, so as to reduce the intensity of reflected light, thereby improving the working performance of the optical components such as the camera.

In addition, in some specific embodiments, the first transparent filler 14 may alternatively be arranged inside the first through hole 130, and adverse impact of display screen puncturing on an optical component is mitigated only by reducing the intensity of the reflected light.

For example, to reduce the reflected light at the interface between the first transparent filler 14 and the encapsulation film layer 12, in some specific embodiments, a second antireflective film layer 121 may alternatively be arranged at the position of the encapsulation film layer 12 corresponding to the first through hole 130. In addition, when the first transparent filler 14 is not arranged inside the first through hole 130, the second antireflective film layer 121 may alternatively be arranged at the position of the encapsulation film layer 12 corresponding to the first through hole 130, so as to reduce the reflected light at the interface between (vacuum inside) the first through hole 130 and the encapsulation film layer 121.

Figure 10:
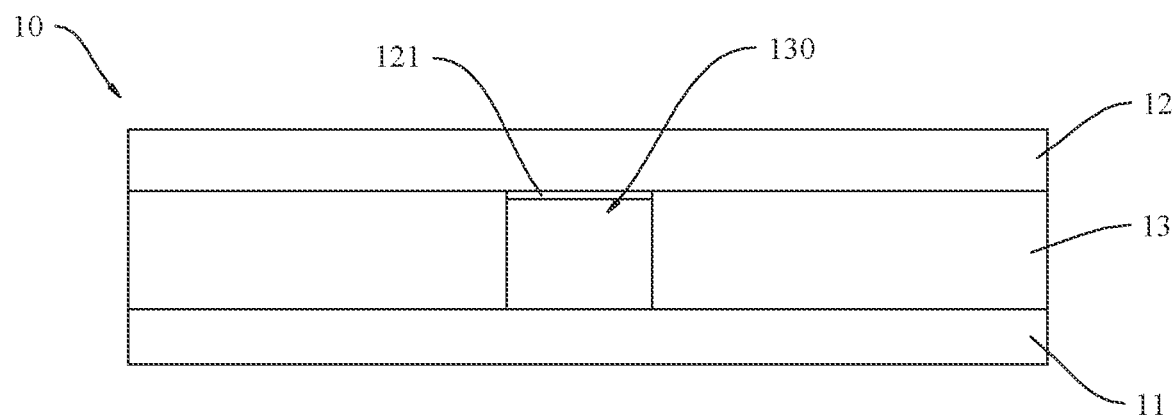
FIG. 10 is a schematic structural diagram of another display screen according to an embodiment of this application.
Figure 11:
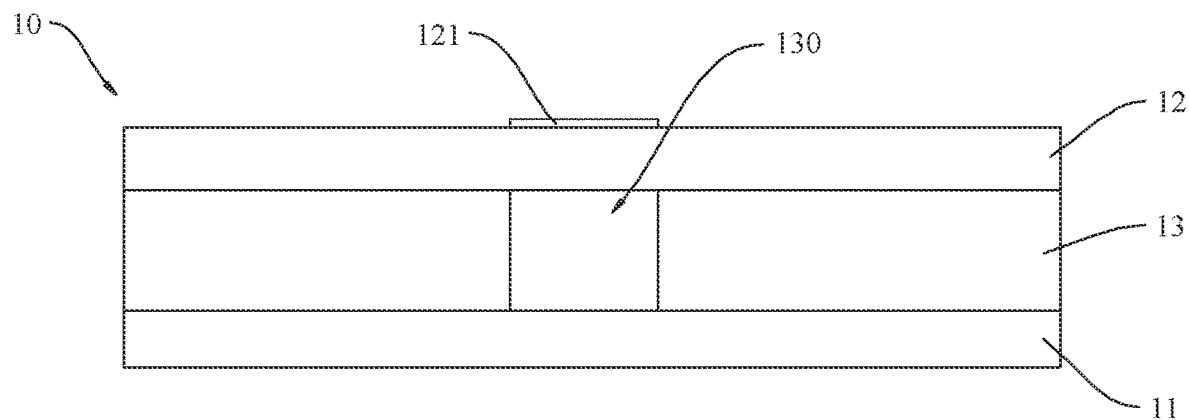
FIG. 11 is a schematic structural diagram of still another display screen according to an embodiment of this application.
Figure 12:
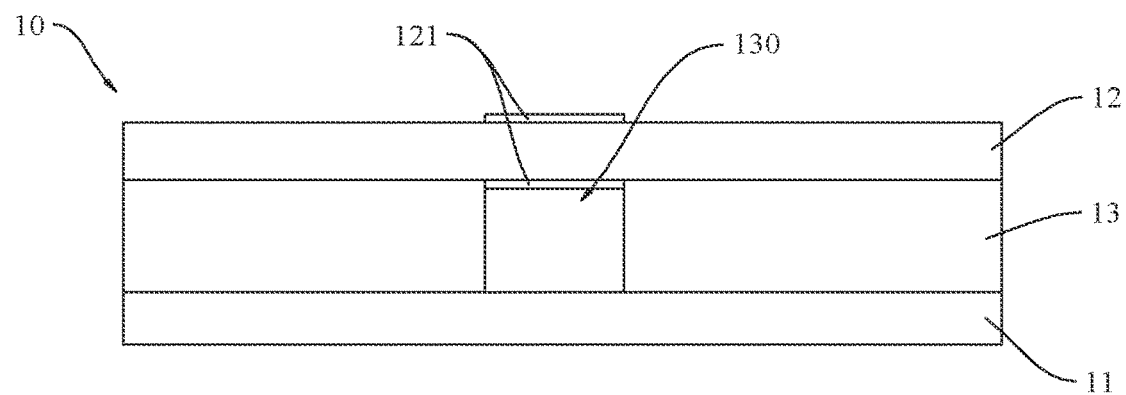
FIG. 12 is a schematic structural diagram of still another display screen according to an embodiment of this application.

During specific implementation, as shown in FIG. 10, the second antireflective film layer 121 may be arranged on a side surface of the encapsulation film layer 12 close to the first through hole 130, so as to reduce the reflected light on the lower surface of the encapsulation film layer 121. As shown in FIG. 11, the second antireflective film layer 121 may alternatively be arranged on a side surface of the encapsulation film layer 12 away from the first through hole 130, so as to reduce the reflected light on the upper surface of the encapsulation film layer. In some specific embodiments, as shown in FIG. 12, the second antireflective film layer 121 may alternatively be arranged on both sides of the encapsulation film layer 12, so as to reduce the intensity of reflected light, thereby improving the working performance of the optical components such as the camera.

Figure 13:
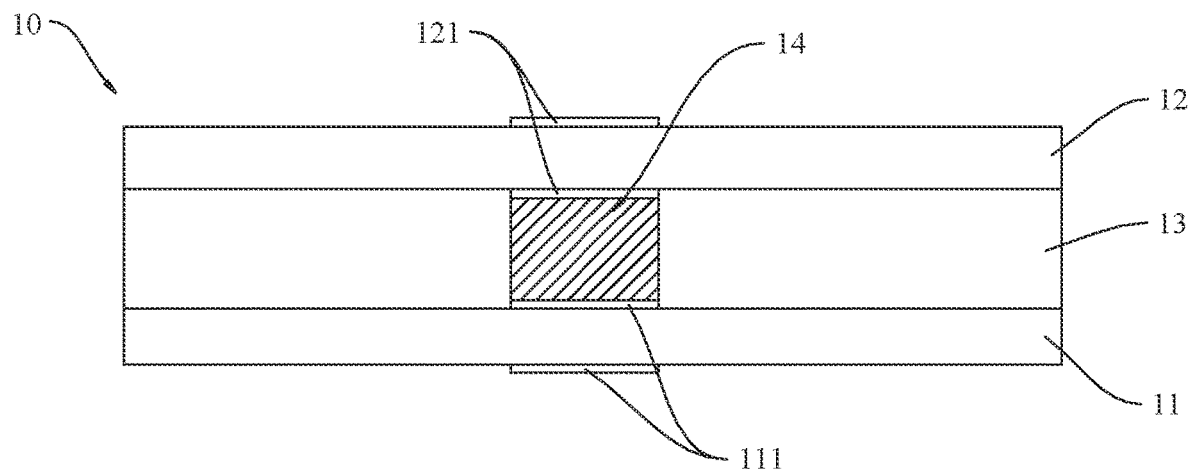
FIG. 13 is a schematic structural diagram of still another display screen according to an embodiment of this application.

As shown in FIG. 13, in some other embodiments, while the first antireflective film layer 111 and the second antireflective film layer 121 are arranged, a first transparent filler 14 may further be arranged in the first through hole 130, so as to effectively avoid affecting the normal operation of the optical components such as the camera.

In addition, to prevent the transparent substrate 11 and the encapsulation film layer 12 from affecting the normal operation of optical components such as the camera, in some specific embodiments, the distance between the transparent substrate 11 and the encapsulation film layer 12 may be increased.

For example, in an embodiment provided in this application, at the first through hole 130, the distance between the transparent substrate 11 and the encapsulation film layer 12 may be kept above 10 μm to effectively avoid affecting the normal operation of the optical components such as the camera.

Figure 14:
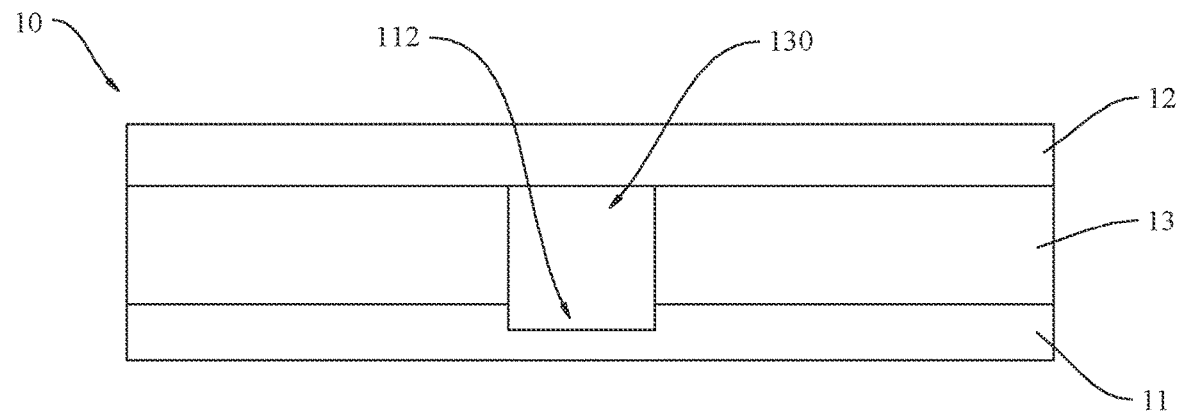
FIG. 14 is a schematic structural diagram of another display screen according to an embodiment of this application.

During specific implementation, as shown in FIG. 14, a first recess 112 may be arranged on a side surface of the transparent substrate 11 directly facing the first through hole 130, so as to increase the distance between the transparent substrate 11 and the encapsulation film layer 12 (at the first through hole 130). Specifically, the first recess 112 may be a blind hole, and a diameter of the blind hole and a diameter of the first through hole 130 may be the same or substantially the same.

In some specific embodiments, a bottom surface of the first recess 112 may be a plane or a curved surface.

Figure 15:
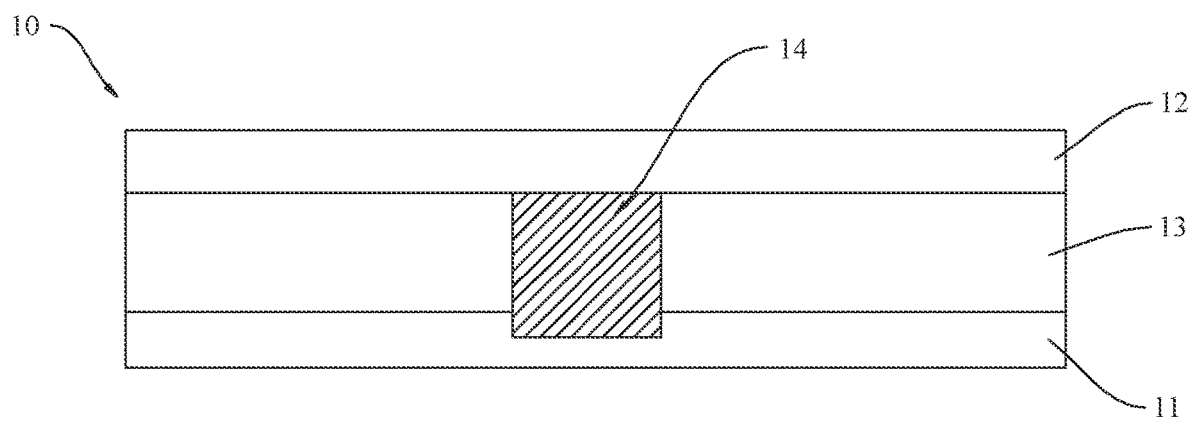
FIG. 15 is a schematic structural diagram of still another display screen according to an embodiment of this application.

As shown in FIG. 14, in an embodiment provided in this application, a bottom surface of the first recess 112 may be a plane. During specific implementation, as shown in FIG. 15, the first transparent filler 14 may further be arranged in the first through hole 130 and the first recess 112 to effectively prevent the transparent substrate 11 and the encapsulation film layer 11 from being bent and deformed.

Figure 16:
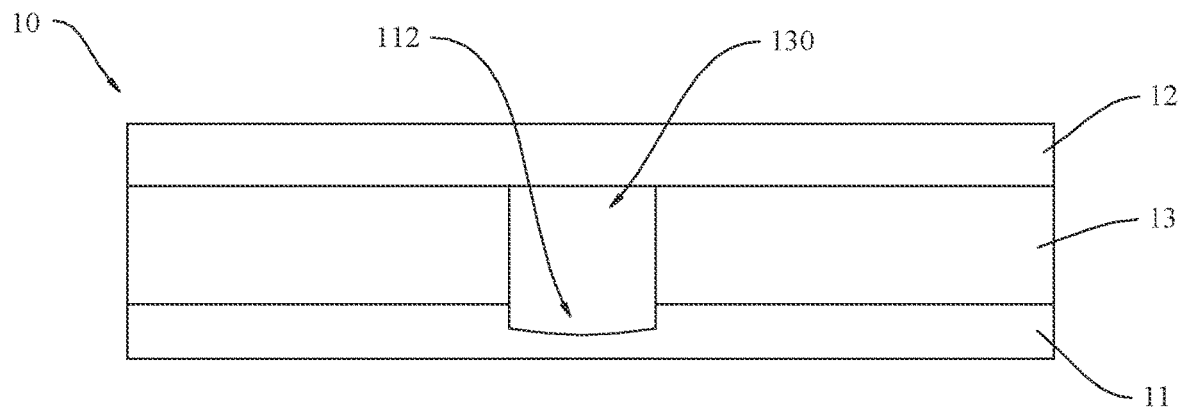
FIG. 16 is a schematic structural diagram of still another display screen according to an embodiment of this application.
Figure 17:
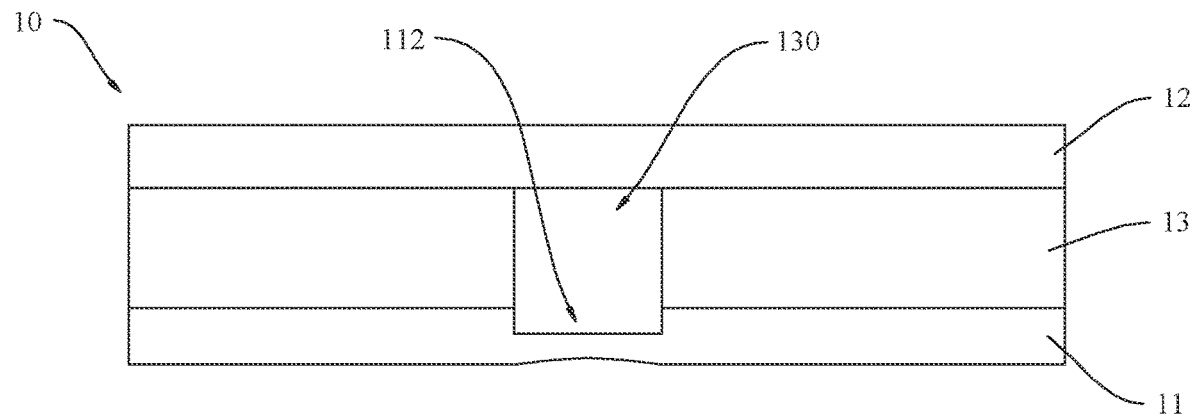
FIG. 17 is a schematic structural diagram of still another display screen according to an embodiment of this application.
Figure 18:
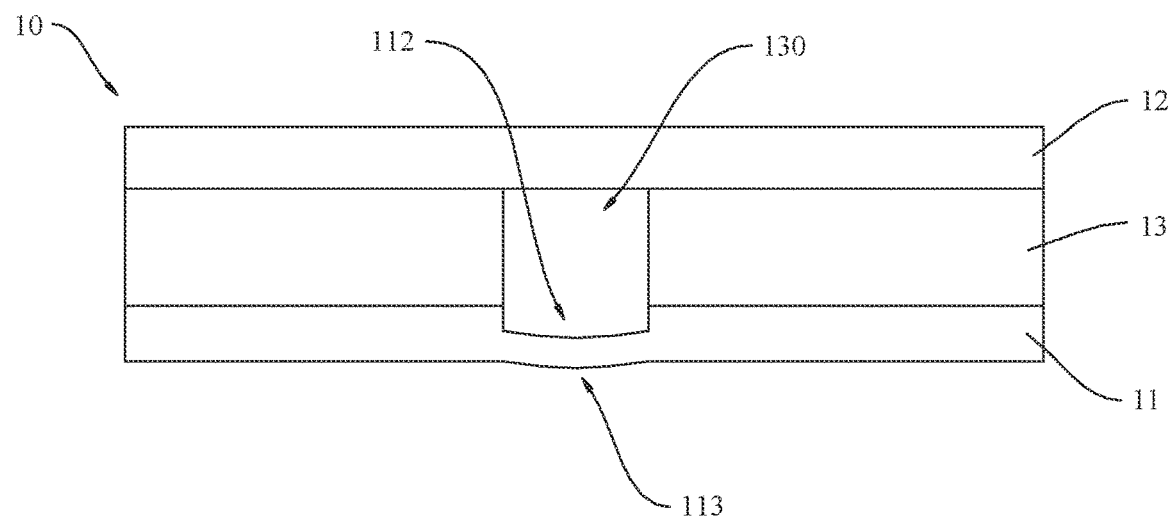
FIG. 18 is a schematic structural diagram of still another display screen according to an embodiment of this application.
Figure 19:
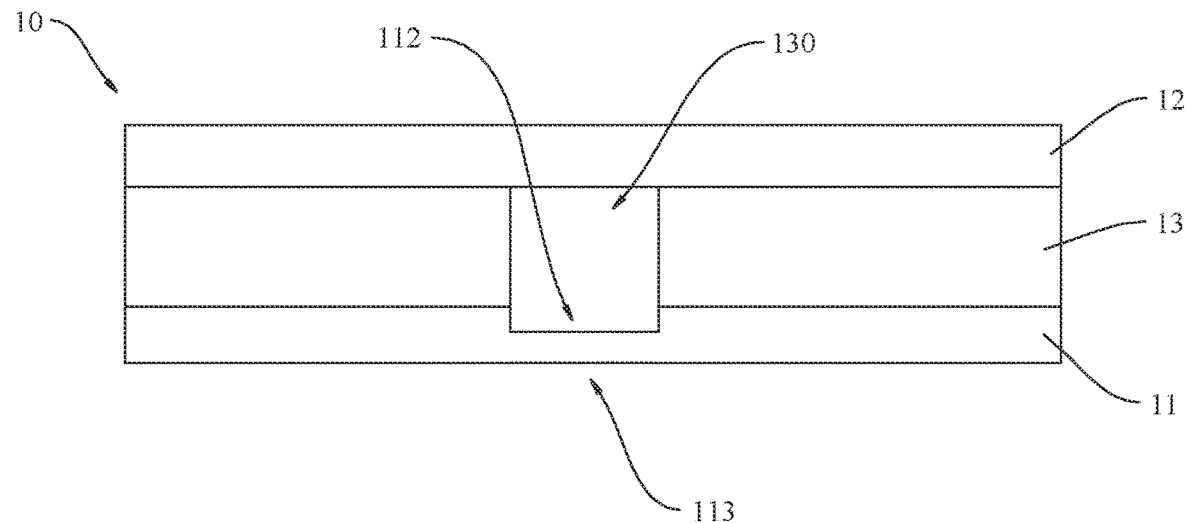
FIG. 19 is a schematic structural diagram of still another display screen according to an embodiment of this application.

As shown in FIG. 16, in another embodiment provided in this application, the bottom surface of the first recess 112 is a concave curved surface. During specific implementation, when the first transparent filler 14 is not arranged in the first through hole 130, the transparent substrate 11 may be bent and deformed toward one side of the first through hole 130. Referring to FIG. 17, when the transparent substrate 11 is bent, the concave curved surface can be deformed to form a plane or a rough plane. This structural arrangement can also effectively avoid affecting the normal operation of optical components such as the camera. During specific implementation, curvature of the curved surface may be reasonably adjusted based on a degree of deformation the transparent substrate 11 can produce, so as to ensure that the curved surface can form a plane as far as possible after the transparent substrate 11 is bent and deformed. In addition, in some specific embodiments, as shown in FIG. 18, a protruding portion 113 may alternatively be arranged on the side surface of the transparent substrate 11 away from the first through hole 130. During specific implementation, a cambered surface of the protruding portion 113 may adapt to the concave curved surface in the first recess 112. It can be understood that the transparent substrate 11 may have a micro-arch structure in the area corresponding to the first through hole 130. Referring to FIG. 19, when the transparent substrate 11 is bent, the concave curved surface in the first recess 112 and the convex cambered surface in the protruding portion 113 can be deformed to form a plane or a rough plane, thereby effectively improving the quality of light transmission.

During specific production, the first recess 112 may be formed by processes such as etching and grinding. For example, when the transparent substrate 11 is made of silicon oxide, hydrofluoric acid or the like can be used to process the transparent substrate 11 to form the first recess 112. When the transparent substrate 11 is made of polyimide, a process such as grinding can be used to process the transparent substrate 11 to form the first recess 112.

To increase the distance between the transparent substrate 11 and the encapsulation film layer 12 at the first through hole 130, a second recess 122 similar to the first recess 112 may alternatively be arranged in the encapsulation film layer 12.

Figure 20:
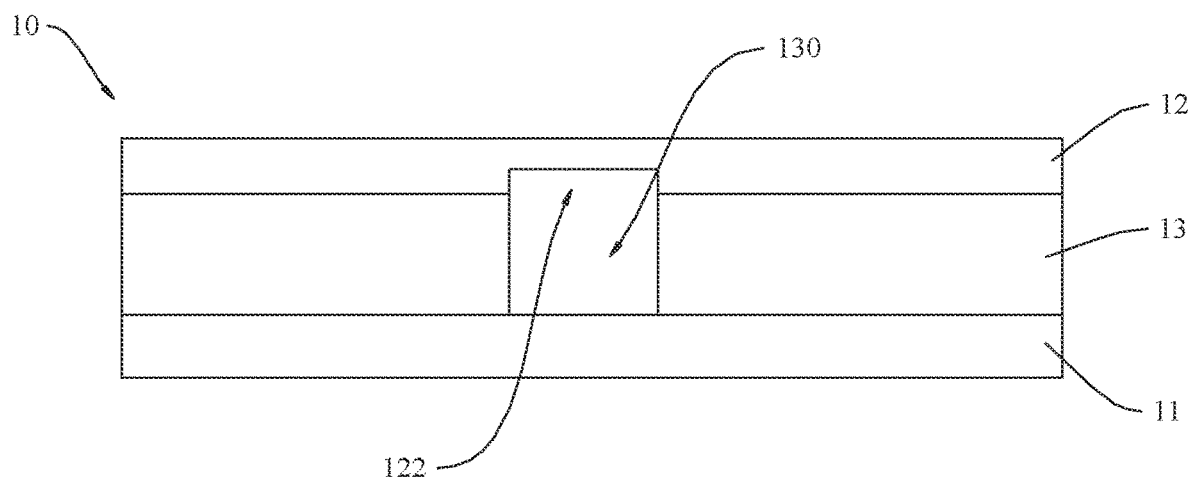
FIG. 20 is a schematic structural diagram of still another display screen according to an embodiment of this application.

As shown in FIG. 20, in an embodiment provided in this application, a second recess 122 may be arranged on a side surface of the encapsulation film layer 12 directly facing the first through hole 130, so as to increase the distance between the transparent substrate 11 and the encapsulation film layer 12 (at the first through hole 130). Specifically, the second recess 122 may be a blind hole, and a diameter of the blind hole and a diameter of the first through hole 130 may be the same or substantially the same.

In some specific embodiments, a bottom surface of the second recess 122 may be a plane or a curved surface.

Figure 21:
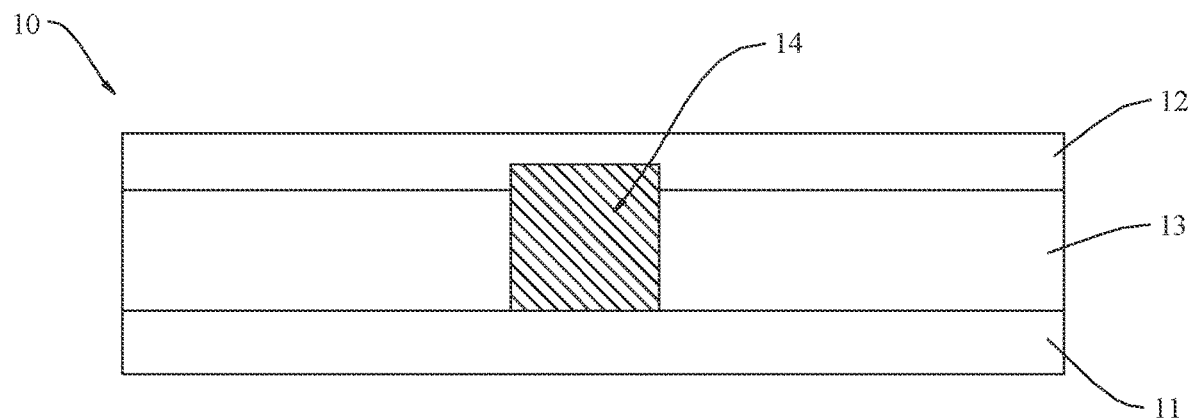
FIG. 21 is a schematic structural diagram of still another display screen according to an embodiment of this application.

As shown in FIG. 20, in an embodiment provided in this application, a bottom surface of the second recess 122 may be a plane. During specific implementation, as shown in FIG. 21, the first transparent filler 14 may further be arranged in the first through hole 130 and the second recess 122 to effectively prevent the encapsulation film layer 12 from being bent and deformed.

Figure 22:
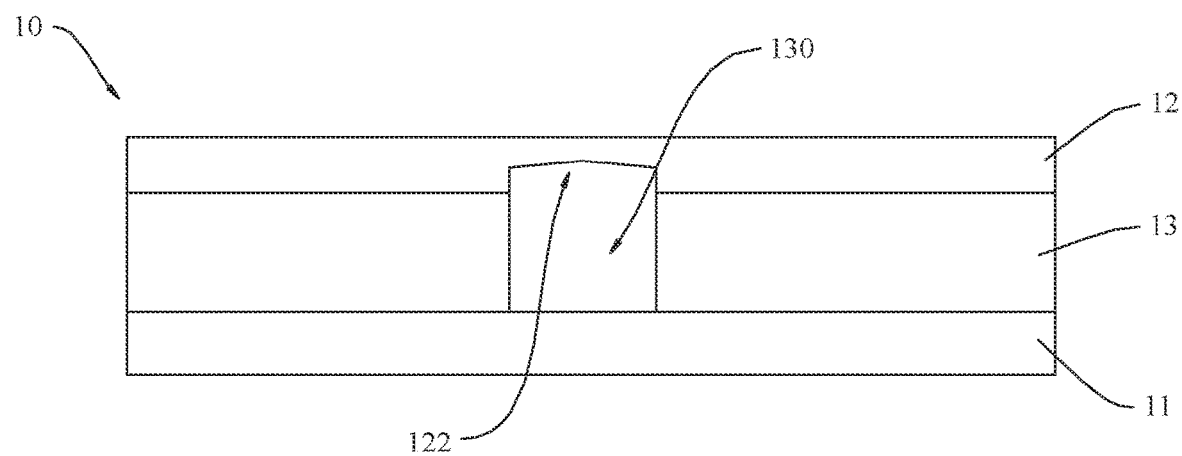
FIG. 22 is a schematic structural diagram of still another display screen according to an embodiment of this application.
Figure 23:
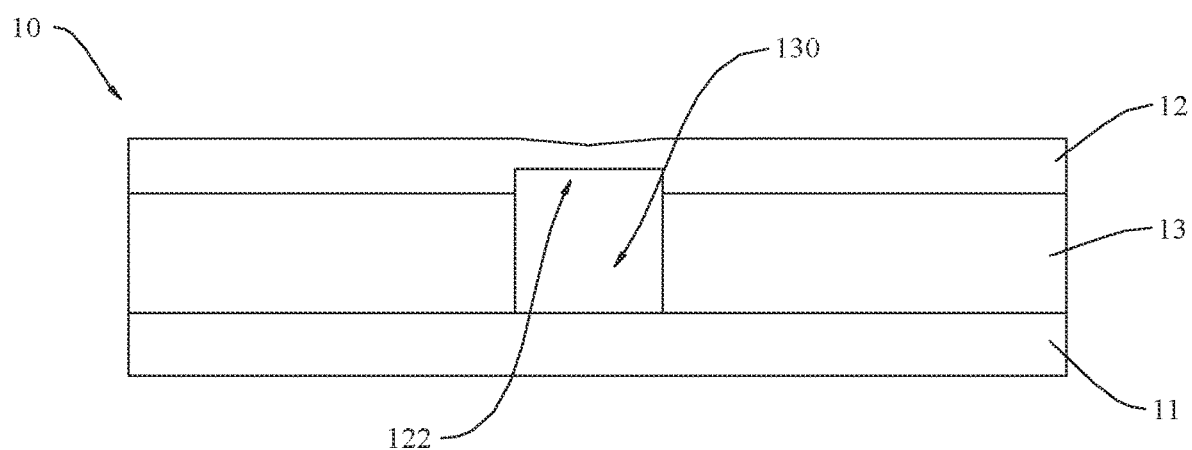
FIG. 23 is a schematic structural diagram of still another display screen according to an embodiment of this application.
Figure 24:
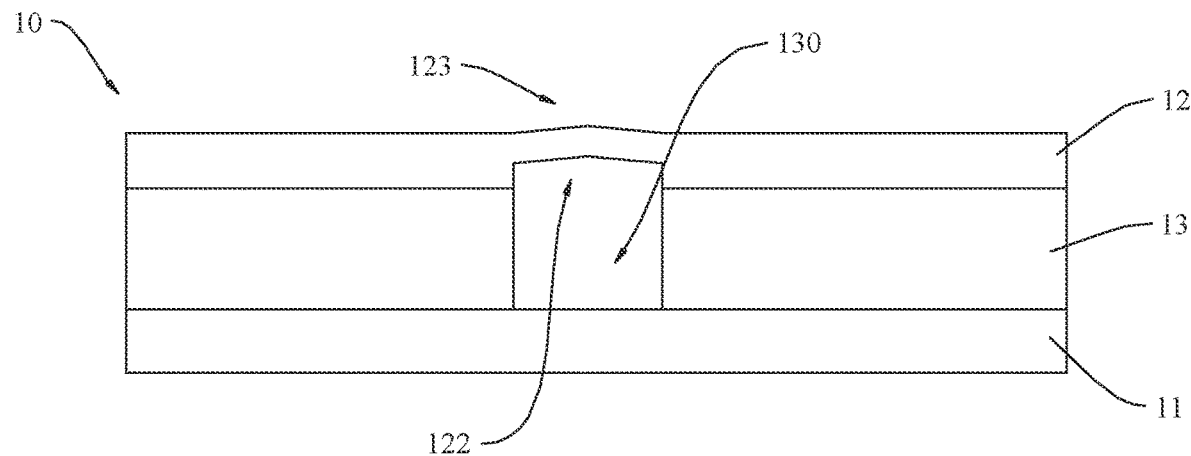
FIG. 24 is a schematic structural diagram of still another display screen according to an embodiment of this application.
Figure 25:
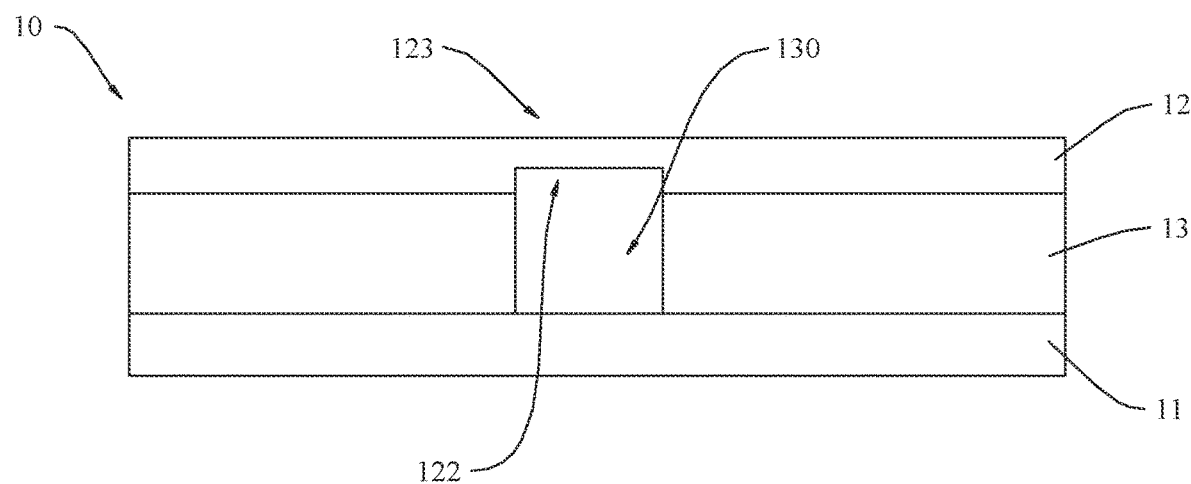
FIG. 25 is a schematic structural diagram of still another display screen according to an embodiment of this application.

As shown in FIG. 22, in another embodiment provided in this application, the bottom surface of the second recess 122 is a concave curved surface. During specific implementation, when the first transparent filler 14 is not arranged in the first through hole 130, the encapsulation film layer 12 may be bent and deformed toward one side of the first through hole 130. When the encapsulation film layer 12 is bent, as shown in FIG. 23, the concave curved surface can be deformed to form a plane or a rough plane. This structural arrangement can also effectively avoid affecting the normal operation of optical components such as the camera. During specific implementation, curvature of the curved surface may be reasonably adjusted based on a degree of deformation the encapsulation film layer 12 can produce, so as to ensure that the curved surface can form a plane as far as possible after the encapsulation film layer 12 is bent and deformed. In addition, in some specific embodiments, as shown in FIG. 24, a protruding portion 123 may alternatively be arranged on the side surface of the encapsulation film layer 12 away from the first through hole 130. During specific implementation, a cambered surface of the protruding portion 123 may adapt to the concave curved surface in the second recess 122. It can be understood that the encapsulation film layer 12 may have a micro-arch structure in the area corresponding to the first through hole 130. Referring to FIG. 25, when the encapsulation film layer 12 is bent, the concave curved surface in the second recess 122 and the convex cambered surface in the protruding portion 123 can be deformed to form a plane or a rough plane, thereby effectively improving the quality of light transmission.

During specific production, the second recess 122 may be formed by processes such as etching and grinding. For example, when the encapsulation film layer 12 is made of silicon oxide, hydrofluoric acid or the like can be used to process the encapsulation film layer 12 to form the second recess 122. When the encapsulation film layer 12 is made of polyimide, a process such as grinding can be used to process the encapsulation film layer 12 to form the second recess 122.

To increase the distance between the transparent substrate 11 and the encapsulation film layer 12 at the first through hole 130, a distance between the entire transparent substrate 11 and the entire encapsulation film layer 12 may alternatively be increased.

For example, a thickness of a display layer 13 may be appropriately increased to keep the thickness of the display layer 13 above 10 μm.

In some specific embodiments, the distance between the transparent substrate 11 and the encapsulation film layer 12 may alternatively be increased by adding another film layer.

Figure 26:
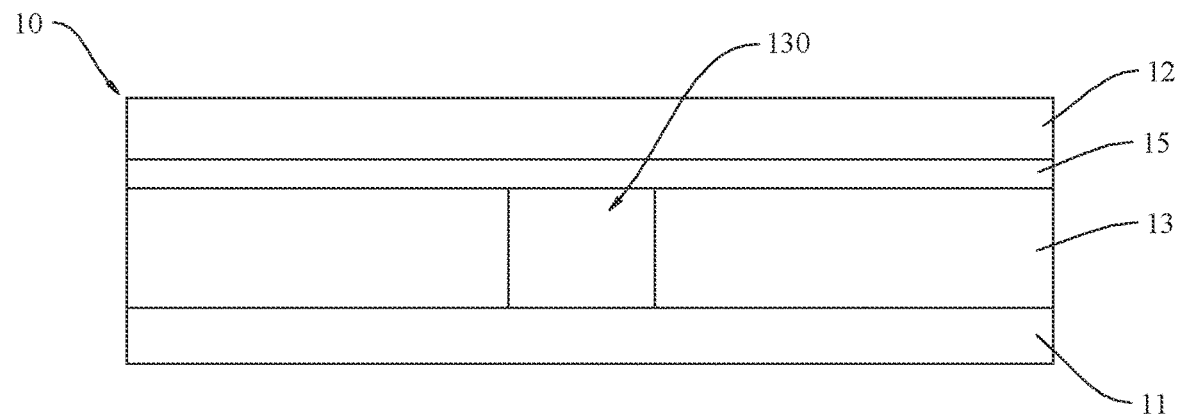
FIG. 26 is a schematic structural diagram of still another display screen according to an embodiment of this application.

For example, as shown in FIG. 26, in an embodiment provided in this application, a thickened film layer 15 may be arranged between the display layer 13 and the encapsulation film layer 12, so as to increase the distance between the encapsulation film layer 12 and the transparent substrate 11.

During specific implementation, the thickened film layer 15 can be made of a material with good light permeability, or can be made of a material with good light-shielding properties.

Specifically, when the thickened film layer 15 is made of a material with good light permeability (such as silicon oxide, polyimide, and the like), the thickened film layer 15 does not affect a display effect of the light-emitting layer 13 (that is, does not shield the light-emitting layer 13), and does not shield the first through hole 130, either. Therefore, the through hole structure may not be arranged in the area corresponding to the first through hole 130.

Figure 27:
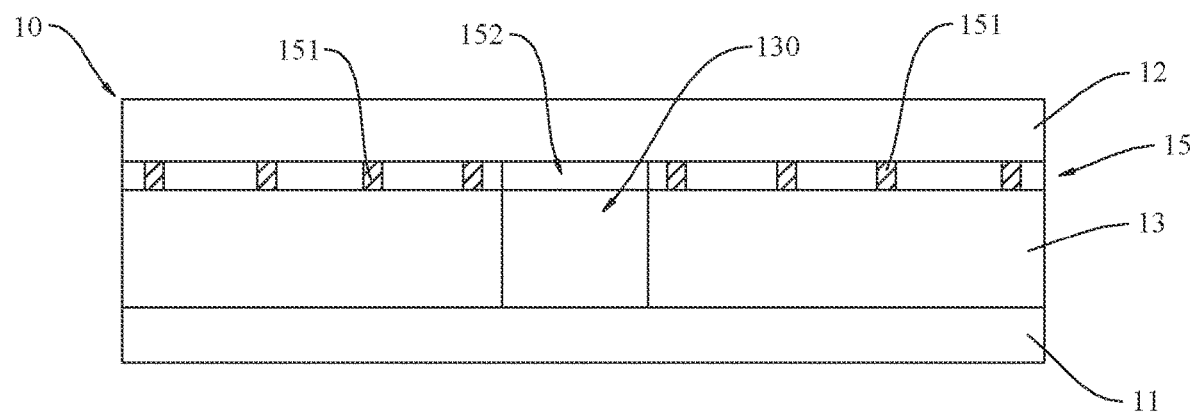
FIG. 27 is a schematic structural diagram of still another display screen according to an embodiment of this application.

When the thickened film layer 15 is made of a material with good light-shielding properties, in order not to affect the display effect of the display layer 13, as shown in FIG. 27, the thickened film layer 15 may include a plurality of blocks 151 arranged at intervals, or the thickened film layer 15 may be patterned to reduce the shielding of the display layer 13 as far as possible, and at the same time, increase the distance between the transparent substrate 11 and the encapsulation film layer 12. In addition, to prevent the thickened film layer 15 from shielding the first through hole 130, in some specific embodiments, a second through hole 152 may be arranged in an area corresponding to the first through hole 130. During specific implementation, projection of the second through hole 152 on the display layer 13 should completely cover the first through hole 130, that is, when the first through hole 130 is coaxial with the second through hole 152, an aperture of the second through hole 152 is not smaller than an aperture of the first through hole 130. When the first through hole 130 is not coaxial with the second through hole 152, the aperture of the second through hole 152 should be larger than the aperture of the first through hole 130, so as to prevent the thickened film layer 15 from shielding the first through hole 130.

In some specific embodiments, the thickened film layer 15 may alternatively be formed by a mixture of a light-transmitting material and a light-shielding material.

Figure 28:
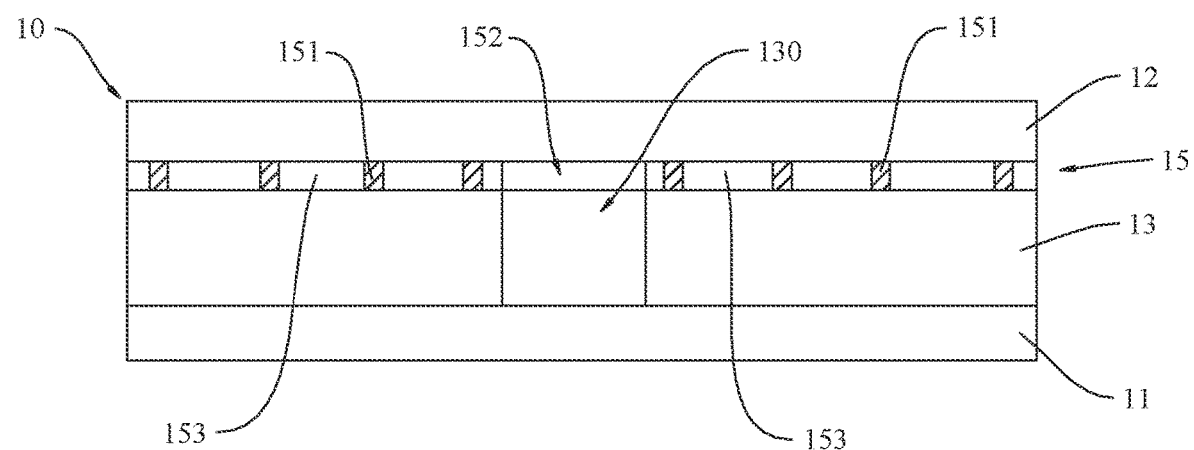
FIG. 28 is a schematic structural diagram of still another display screen according to an embodiment of this application.

For example, as shown in FIG. 28, in an embodiment provided in this application, a partial area 153 of the thickened film layer 15 has good light permeability, and another partial area 151 of the thickened film layer 15 has good light-shielding properties.

In some specific embodiments, a light-transmitting area and an opaque area in the thickened film layer 15 may alternatively be dedicatedly arranged.

Figure 29:
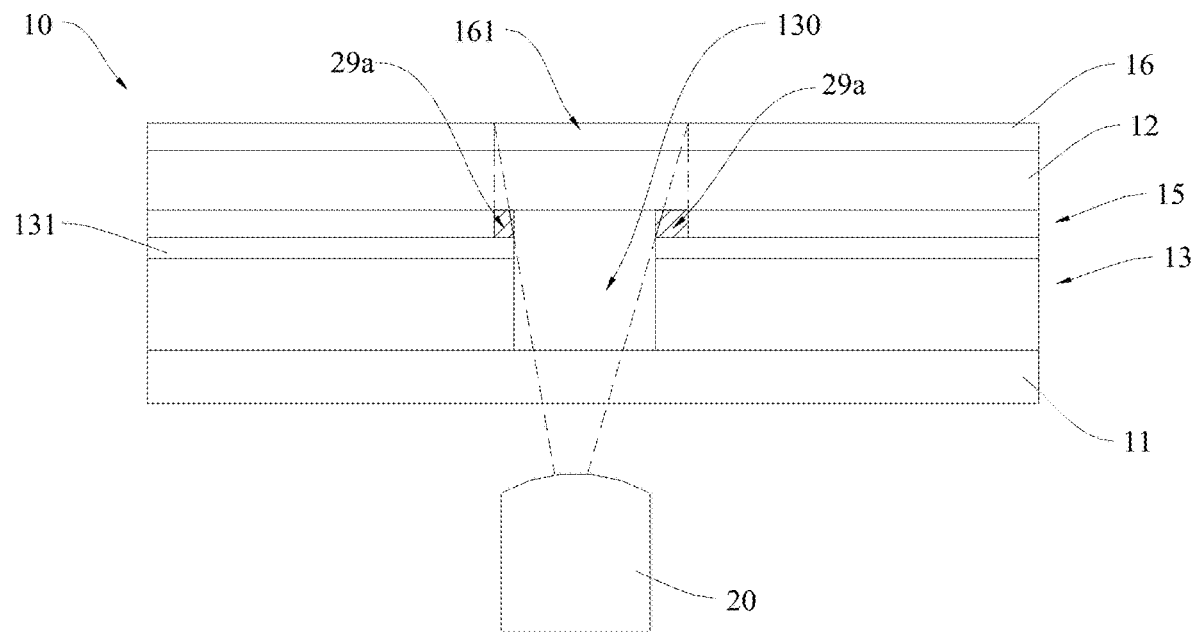
FIG. 29 is a schematic structural diagram of a combination of a display screen and a camera according to an embodiment of this application.

For example, as shown in FIG. 29, in an embodiment provided in this application, the display screen 10 further includes a polarizer 16, and the polarizer 16 is located on the side surface of the encapsulation film layer 12 away from the display layer 13; in order not to affect the working performance of optical components such as the camera, the polarizer is provided with a third through hole 161 directly facing the first through hole 130, and projection of the third through hole 161 on the display layer 13 completely covers the first through hole 130.

Specifically, when the first through hole 130 and the third through hole 161 are arranged coaxially, an aperture of the third through hole 161 should not be smaller than the aperture of the first through hole 130, so as to prevent the polarizer 16 from shielding the first through hole 130; when the first through hole 130 is not coaxial with the third through hole 161, the aperture of the third through hole 161 should be larger than the aperture of the first through hole 130, so as to prevent the polarizer 16 from shielding the first through hole 130.

Further referring to FIG. 29, the camera 20 is used as an example. In actual application, an image capture angle of the camera 20 is similar to a cone. Therefore, the diameter of the third through hole 161 may be slightly larger than the diameter of the first through hole 130. During specific implementation, the opening diameter of the first through hole 130 may be minimized, so as to maximize the supporting effect of the display layer 13 between the transparent substrate 11 and the encapsulation film layer 12, and prevent the transparent substrate 11 and the encapsulation film layer 12 from being deformed. However, because a cathode layer 131 or a wire (such as a driver circuit) in the display layer 13 is usually made of a metal material, the cathode layer or the wire has a high light-reflecting characteristic. As a result, when watching the screen, a user sees a circle of bright lines formed by the reflection of the cathode layer 131. In some specific embodiments, an area 29a of the thickened film layer 15 close to the first through hole 130 may be made of opaque material, so as to shield the exposed cathode layer 131.

In some other specific embodiments, an additional light-shielding layer 17 may alternatively be arranged to shield the exposed cathode layer 131.

Figure 30:
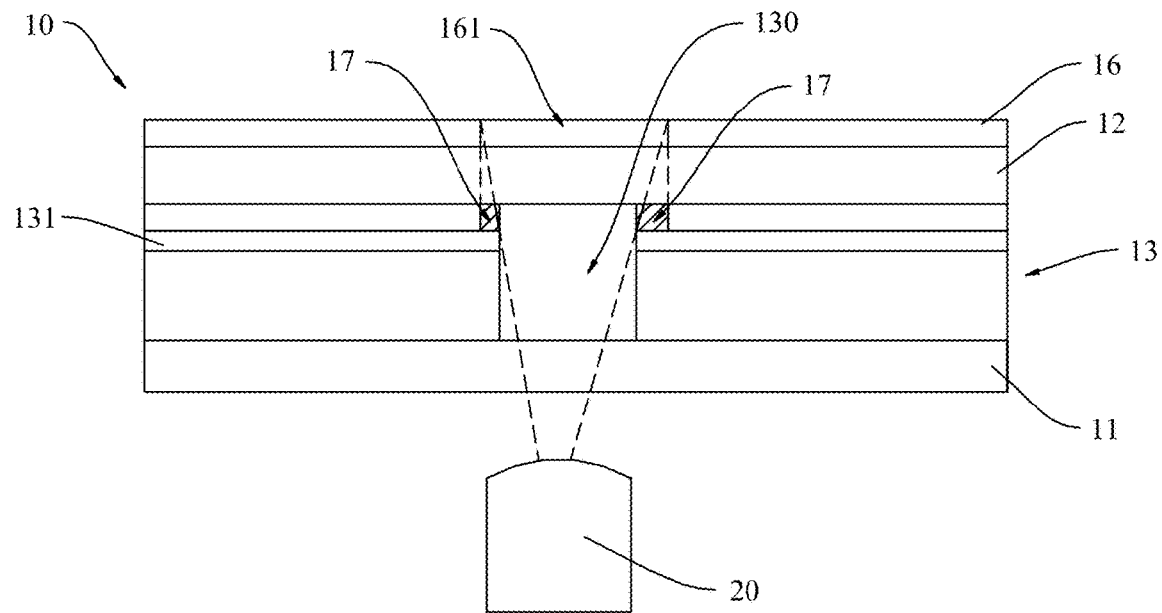
FIG. 30 is a schematic structural diagram of another combination of a display screen and a camera according to an embodiment of this application.

Specifically, as shown in FIG. 30, in an embodiment provided in this application, the display screen 10 may further include a light-shielding layer 17, and the light-shielding layer 17 may be arranged between the display layer and the encapsulation film layer 12, and cover the projection area of the third through hole 161 on the display layer 13.

Specifically, because the aperture of the third through hole 161 is larger than the aperture of the first through hole 130, the projection of the third through hole 161 on the display layer 20 is a circular ring area (that is, the area in which the cathode layer 131 is exposed); during specific implementation, the light-shielding layer 17 may be a circular ring structure to well shield the exposed cathode layer 131.

In other embodiments, the light-shielding layer 17 may alternatively be arranged on the side surface of the encapsulation film layer 12 away from the display layer, or the light-shielding layer 17 may be arranged on both sides of the encapsulation film layer 12.

During specific implementation, the light-shielding layer 17 may be made of ink, vinyl, or another material with good light-shielding properties.

Figure 31:
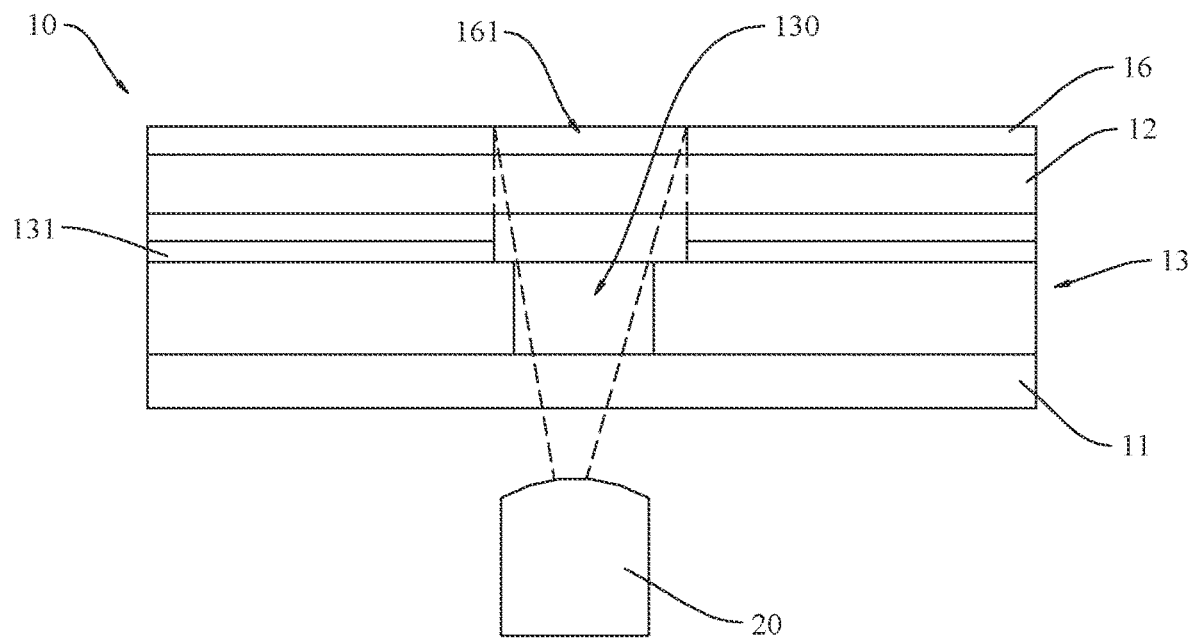
FIG. 31 is a schematic structural diagram of still another combination of a display screen and a camera according to an embodiment of this application.

In some specific embodiments, the light-shielding layer 17 may alternatively be formed on the cathode layer 131 by using a process such as electroplating or spraying; alternatively, as shown in FIG. 31, the exposed cathode layer 131 may be removed by using a process such as etching.

It can be understood that, in the foregoing embodiment, the first transparent filler 14 may still be arranged in the first through hole 130 to prevent the transparent substrate 11 and the encapsulation film layer 12 from being deformed.

Figure 32:
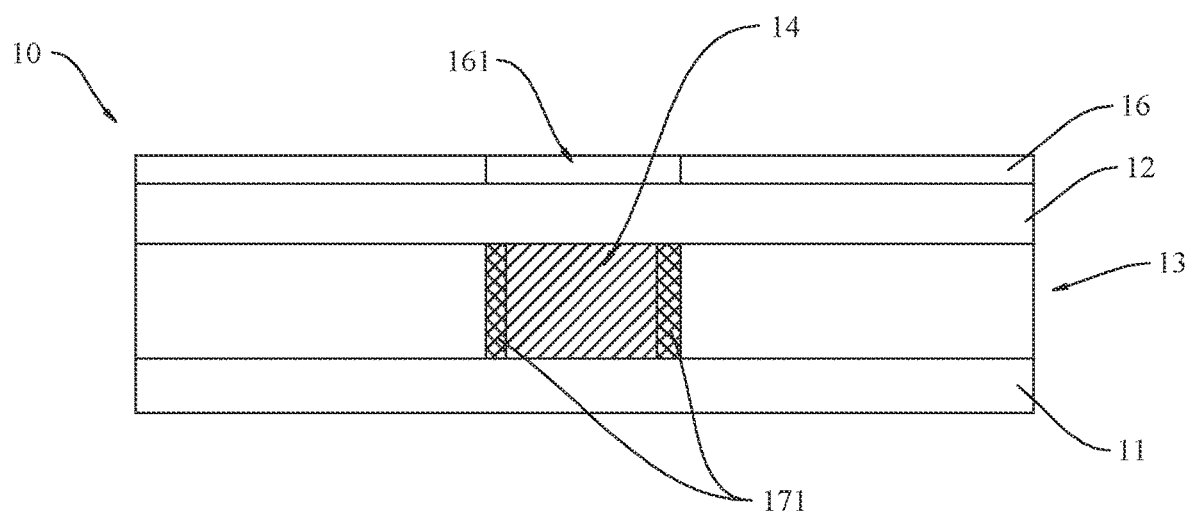
FIG. 32 is a schematic structural diagram of a display screen according to an embodiment of this application.

In addition, in some specific embodiments, as shown in FIG. 32, a light-shielding material 171 (such as vinyl) may alternatively be arranged on an inner wall of the first through hole 130 to effectively prevent generation of bright lines, and further effectively prevent overflow of the first transparent filler 14 in the first through hole 130.

In addition, in some specific embodiments, to make the display screen 10 have good structural strength and prevent the display screen 10 from being damaged when subjected to external force, the display screen 10 may further include a transparent cover plate 18.

Figure 33:
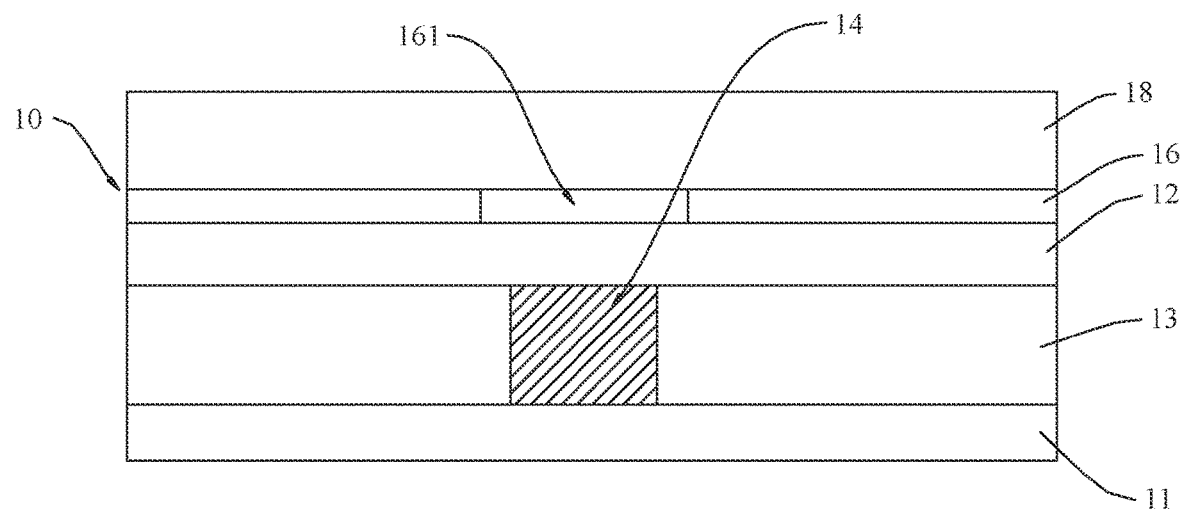
FIG. 33 is a schematic structural diagram of another display screen according to an embodiment of this application.

As shown in FIG. 33, the transparent cover plate 18 may be attached to the side surface of the polarizer 16 away from the encapsulation film layer 12 through materials such as optically clear adhesive (OCA). During specific implementation, the transparent cover plate 18 may be a glass plate or a plate-like structure made of polyimide or another material.

Figure 34:
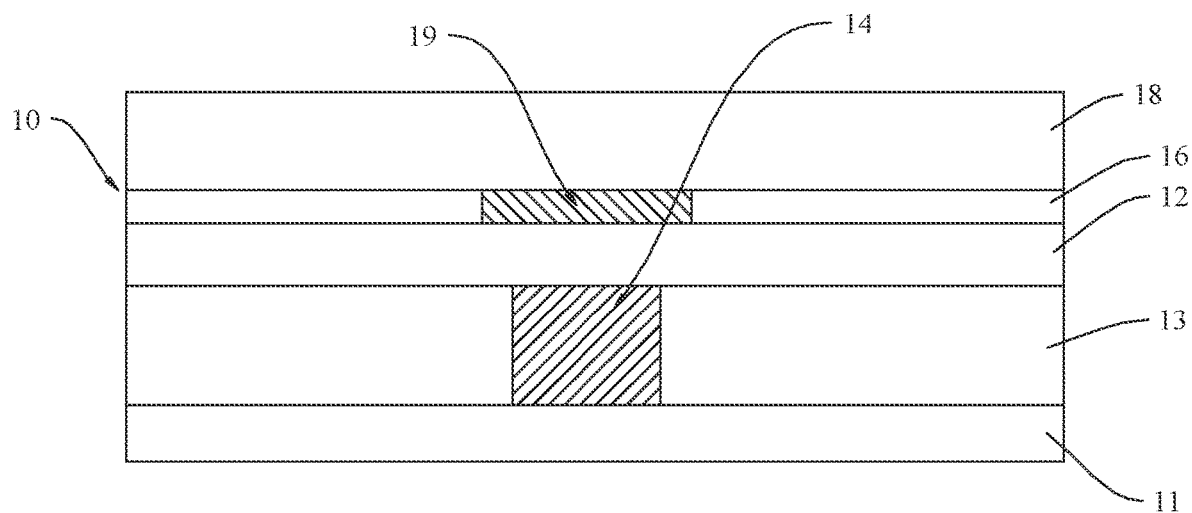
FIG. 34 is a schematic structural diagram of still another display screen according to an embodiment of this application.

In addition, in some specific embodiments, because the polarizer 16 is provided with a third through hole 161, to prevent the encapsulation film layer 12 from being deformed, referring to FIG. 34, in some specific embodiments, a second transparent filler 19 similar to the first transparent filler 14 may further be arranged in the third through hole 161. Specifically, the second transparent filler 19 may be a gaseous substance or a solid substance. For example, when the second transparent filler 19 is a gaseous substance, which may be an inert gas such as nitrogen, ammonia, or neon, in actual application, air pressure in the third through hole 161 can be effectively controlled by adjusting an amount of gas in the third through hole 161, so as to ensure that a pressure difference between the inside and the outside of the third through hole 161 is small. This effectively prevents undesirable phenomena such as rainbow patterns. When the second transparent filler 19 is a solid substance, it may be materials such as indium tin oxide (ITO), optically clear adhesive (OCA), or the like, so as to form a support and connection between the transparent cover plate 18 and the encapsulation film layer 12, preventing the transparent cover plate 18 and the encapsulation film layer 12 from being bent and deformed, thereby effectively preventing undesirable phenomena such as rainbow patterns. In actual application, the second transparent filler 19 may fill up the third through hole 161, or may be arranged in a partial area of the third through hole 161.

Figure 35:
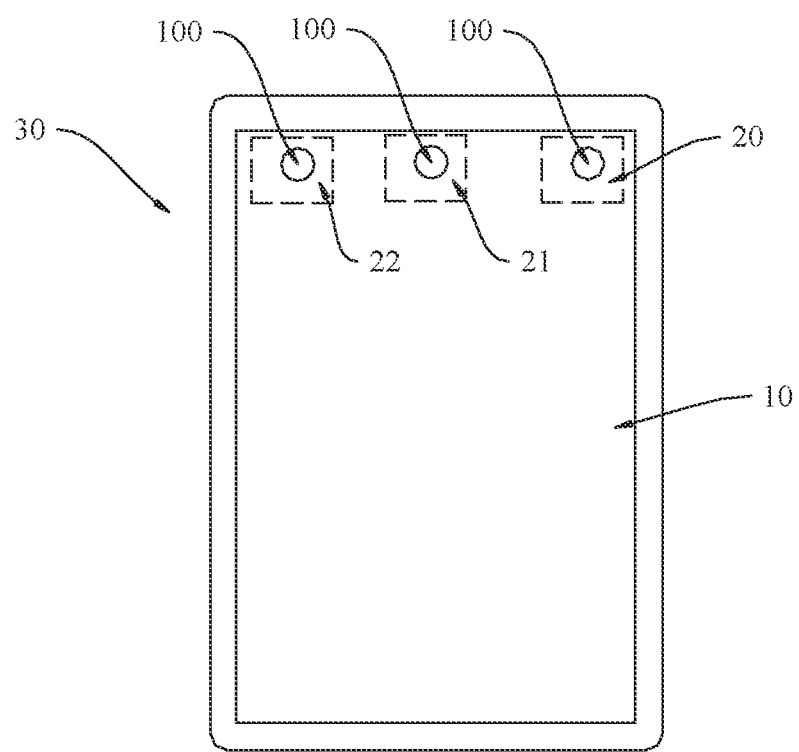
FIG. 35 is a schematic structural diagram of an electronic device according to an embodiment of this application.

In addition, as shown in FIG. 35, an embodiment of this application further provides an electronic device 30. The electronic device 30 may be specifically a mobile phone, a tablet computer, a monitor, a TV, or the like. For example, the electronic device 30 is a mobile phone. The mobile phone may include a camera 20 and the display screen 10 in any one of the foregoing embodiments.

During specific implementation, the camera 20 may be mounted below the display screen 10, and is arranged directly facing a light-transmitting hole 100 (a first through hole 130 in a display layer 13) in the display screen 10, so that external light can enter the camera 20 through the light-transmitting hole 100.

In another embodiment, in addition to the camera 20, the mobile phone may further be provided with a light sensor 21 and a distance sensor 22. To achieve a high screen-to-body ratio, the light sensor 21 and the distance sensor 22 may be mounted below the display screen 10. In addition, to ensure normal operation of the light sensor 21 and the distance sensor 22, two light-transmitting holes 100 that are respectively opposite to the light sensor 21 and the distance sensor 22 may be additionally arranged in the display screen 10.

During specific implementation, a quantity and position arrangement of the light-transmitting holes 100 may be adjusted based on actual conditions. In addition, sizes of the light-transmitting holes 100 may be the same or different.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A display screen, comprising:
   a substrate;
   an encapsulation layer; and
   a display layer located between the substrate and the encapsulation layer;
   wherein the display layer has at least one first through hole that penetrates to both side surfaces of the display layer;
   wherein a first transparent filler is arranged within the at least one first through hole;
   wherein a second recess is arranged on a side surface of the encapsulation layer facing the at least one first through hole, wherein the second recess is a blind hole that does not penetrate a full thickness of the encapsulation layer.

2. The display screen according to claim 1, wherein the first transparent filler is used to support the substrate and the encapsulation layer.

3. The display screen according to claim 2, wherein the first transparent filler fills up the at least one first through hole.

4. The display screen according to claim 1, wherein, at the at least one first through hole, a distance between the substrate and the encapsulation layer is not less than 10 µm.

5. The display screen according to claim 4, wherein a first recess is arranged on a side surface of the substrate facing the at least one first through hole.

6. The display screen according to claim 4, further comprising:
   a thickened film layer arranged between the display layer and the encapsulation layer.

7. The display screen according to claim 6,
   wherein the thickened film layer is provided with a second through hole; and
   wherein projection of the second through hole on the display layer completely covers the at least one first through hole.

8. The display screen according to claim 1, further comprising:
   a polarizing film layer;
   wherein the polarizing film layer is arranged on a side surface of the encapsulation layer away from the display layer, and wherein the polarizing film layer is provided with a third through hole facing the at least one first through hole; and
   wherein projection of the third through hole on the display layer completely covers the at least one first through hole.

9. The display screen according to claim 8, further comprising:
   a transparent cover plate, wherein the transparent cover plate is attached to a side surface of the encapsulation layer away from the display layer.

10. An electronic device, comprising:
    an optical component; and
    the display screen according to claim 1,
    wherein the optical component is arranged facing the at least one first through hole.

11. The electronic device according to claim 10, wherein the first transparent filler is used to support the substrate and the encapsulation layer.

12. The electronic device according to claim 11, wherein the first transparent filler fills up the at least one first through hole.

13. The electronic device according to claim 10, wherein, at the at least one first through hole, a distance between the substrate and the encapsulation layer is not less than 10 µm.

14. The electronic device according to claim 13, wherein a first recess is arranged on a side surface of the substrate facing the at least one first through hole.

15. The electronic device according to claim 10, further comprising:
    a polarizing film layer;
    wherein the polarizing film layer is arranged on a side surface of the encapsulation layer away from the display layer, and wherein the polarizing film layer is provided with a third through hole facing the at least one first through hole; and
    wherein projection of the third through hole on the display layer completely covers the at least one first through hole.

16. The electronic device according to claim 15, further comprising:
    a shielding layer, wherein the shielding layer is arranged between the display layer and the encapsulation layer, and the shielding layer covers a projection area of the third through hole on the display layer.

17. The electronic device according to claim 15, further comprising:
    a transparent cover plate, wherein the transparent cover plate is attached to a side surface of the encapsulation layer away from the display layer.

18. The electronic device according to claim 10, wherein the display screen is an organic light-emitting diode (OLED) display screen; and wherein a bottom surface of the second recess is a plane.

19. The display screen according to claim 1, wherein the display screen is an organic light-emitting diode (OLED) display screen; and wherein a bottom surface of the second recess is a plane.

20. An electronic device, comprising a display screen, wherein the display screen comprises:
- a substrate;
- an encapsulation layer; and
- a display layer located between the substrate and the encapsulation layer;
- wherein the display layer has at least one first through hole that penetrates to both side surfaces of the display layer;
- wherein a recess is arranged on an upper surface of the substrate corresponding to the at least one first through hole; and
- wherein, at the at least one first through hole, a distance between the substrate and the encapsulation layer is not less than 10 μm.

\* \* \* \* \*